(12) United States Patent
Nakai et al.

(10) Patent No.: US 8,809,931 B2
(45) Date of Patent: Aug. 19, 2014

(54) NONVOLATILE SEMICONDUCTOR MEMORY DEVICE

(71) Applicant: Kabushiki Kaisha Toshiba, Tokyo (JP)

(72) Inventors: Tsukasa Nakai, Hino (JP); Nobutoshi Aoki, Yokohama (JP); Takashi Izumida, Yokohama (JP); Masaki Kondo, Kawasaki (JP); Toshiyuki Enda, Zushi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/847,765

(22) Filed: Mar. 20, 2013

(65) Prior Publication Data

US 2013/0248965 A1    Sep. 26, 2013

(30) Foreign Application Priority Data

Mar. 22, 2012    (JP) ................................. 2012-066386

(51) Int. Cl.
*H01L 29/788*    (2006.01)

(52) U.S. Cl.
USPC ........... 257/315; 257/314; 257/316; 257/324; 365/185.26; 438/257; 438/287

(58) Field of Classification Search
USPC ............. 257/315, 314, 316, 324; 365/185.26; 438/257, 287
See application file for complete search history.

(56) References Cited

U.S. PATENT DOCUMENTS

| | | | | |
|---|---|---|---|---|
| 7,482,653 B2 * | 1/2009 | Sandhu et al. | ................ | 257/315 |
| 2006/0212976 A1 | 9/2006 | Khang et al. | | |
| 2008/0009115 A1 * | 1/2008 | Willer et al. | .................. | 438/257 |
| 2008/0237697 A1 | 10/2008 | Shimizu et al. | | |
| 2010/0207190 A1 | 8/2010 | Katsumata et al. | | |
| 2011/0309425 A1 * | 12/2011 | Purayath et al. | .............. | 257/316 |
| 2013/0214415 A1 * | 8/2013 | Pachamuthu et al. | ......... | 257/751 |
| 2013/0292757 A1 * | 11/2013 | Aritome | ....................... | 257/316 |

FOREIGN PATENT DOCUMENTS

JP    2002-231834 A    8/2002
JP    2010-225694 A    10/2010

* cited by examiner

*Primary Examiner* — Errol Fernandes
(74) *Attorney, Agent, or Firm* — Holtz Holtz Goodman & Chick PC

(57) ABSTRACT

According to one embodiment, there is provided a nonvolatile semiconductor memory device including a substrate, a laminated film which has a configuration where first insulating layers and first electrode layers are alternately laminated in a first direction vertical to the substrate, a second insulating layer formed on an inner wall of a first through hole pierced in the first insulating layers and the first electrode layers along the first direction, an intermediate layer formed on a surface of the second insulating layer, a third insulating layer formed on a surface of the intermediate layer, and a pillar-like first semiconductor region which is formed on a surface of the third insulating layer and extends along the first direction.

13 Claims, 32 Drawing Sheets

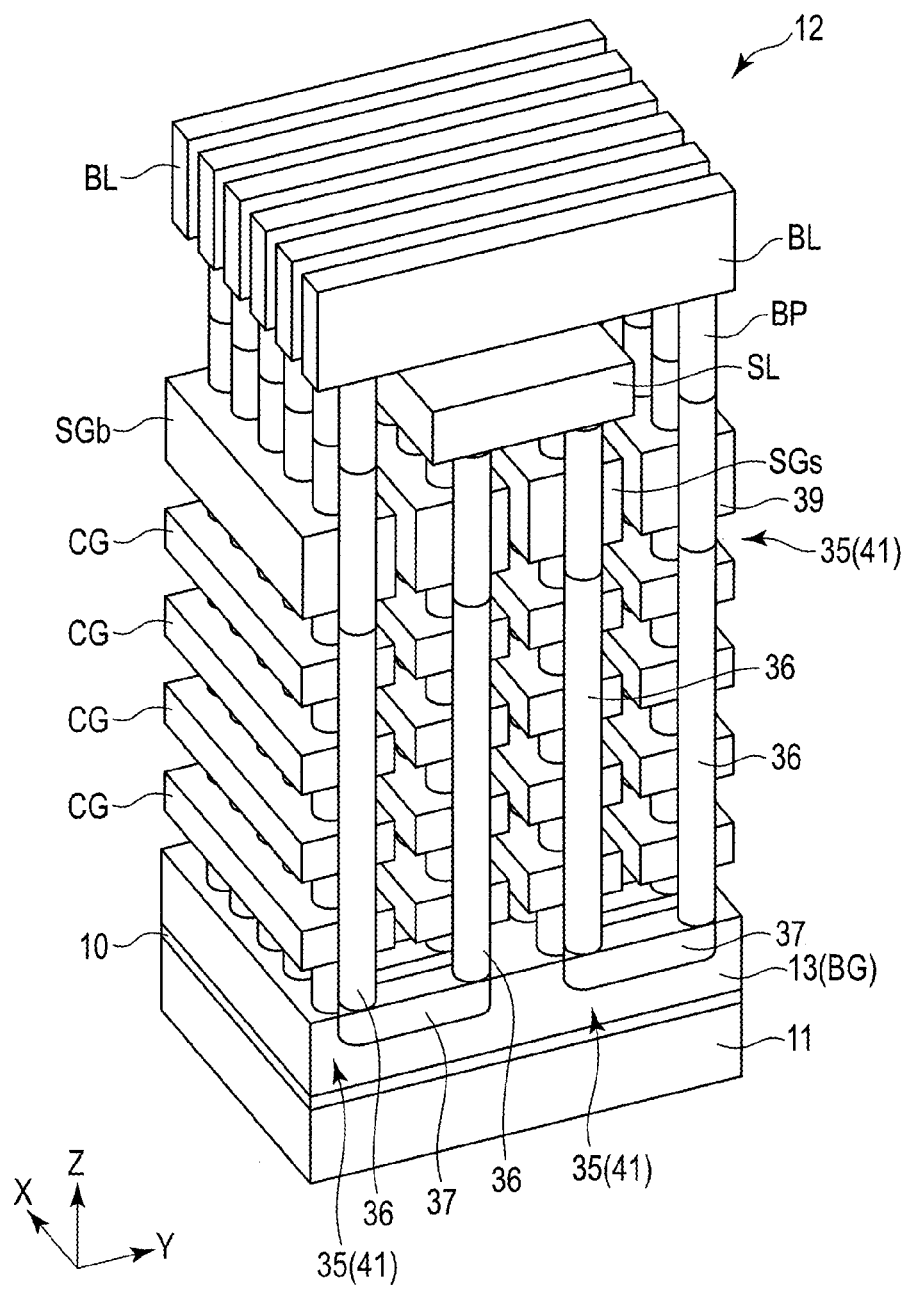
F I G. 3

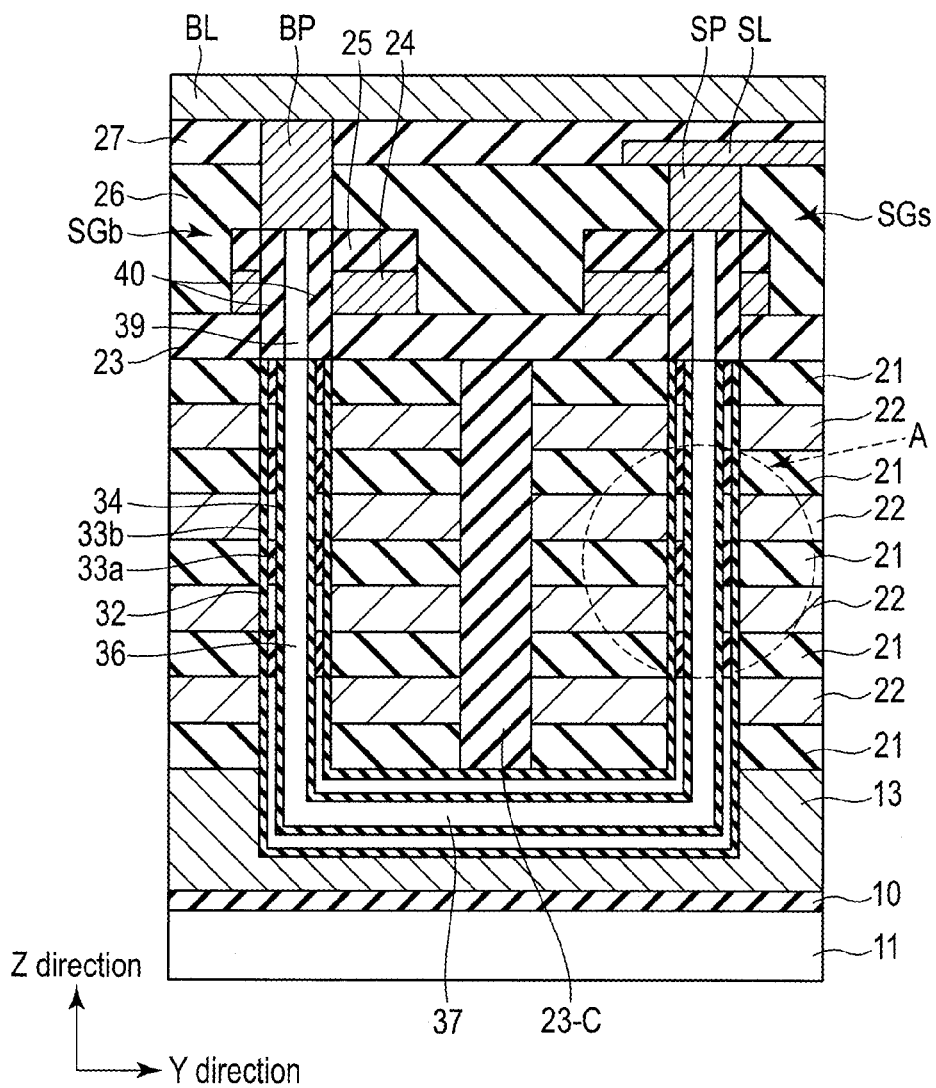
F I G. 4

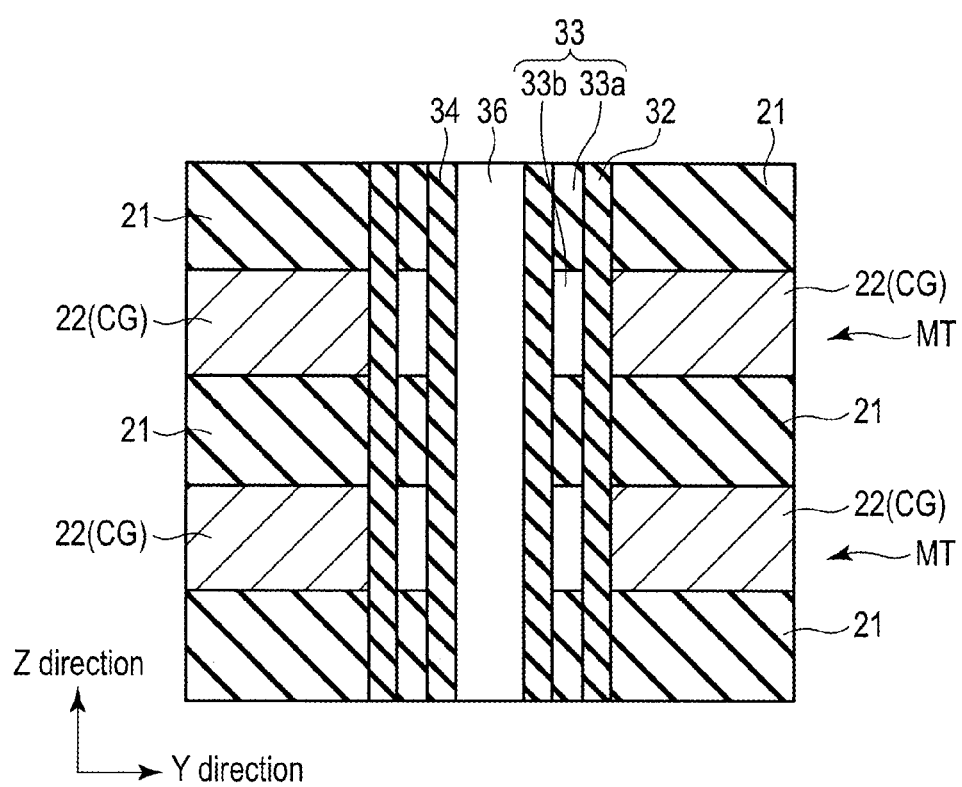
F I G. 5

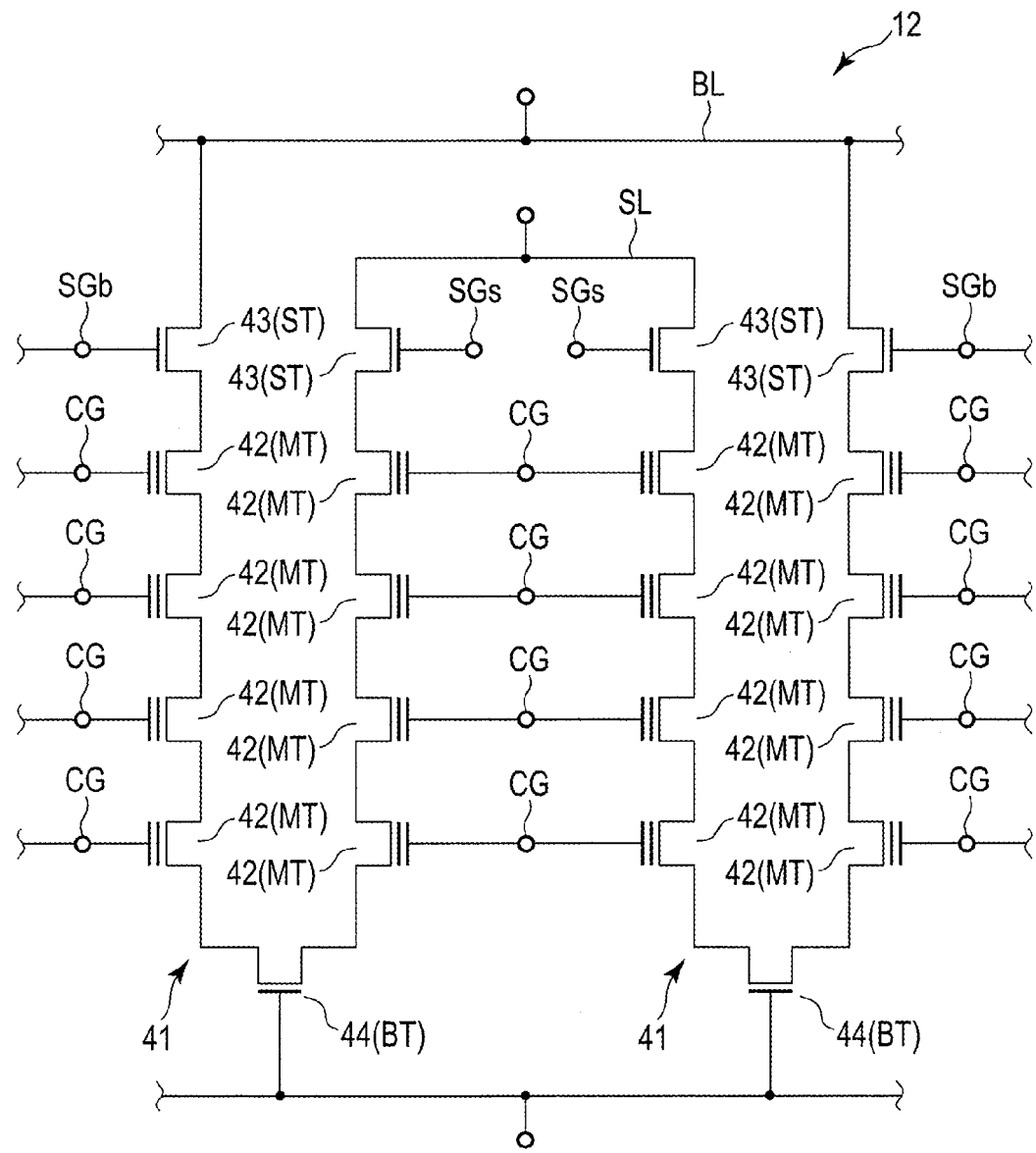
F I G. 6

| | Write operation | | Read operation | | Erase operation |
|---|---|---|---|---|---|
| | Selected | Non-selected | Selected | Non-selected | Selected block |
| Bit line BL | Value "0"...Vss<br>Value "1"...Vdd | Voff | Vbl | | Verase |
| Selection gate electrode SGb | Vsg | Voff | Von | Voff | Vsg |
| Control gate electrode CGb (Fourth layer) | Vpass | Vpass | Vread | Vread | Vss |
| Control gate electrode CGb (Third layer) | Vprg | Vprg | Vss | Vss | Vss |
| Control gate electrode CGb (Second layer) | Vpass | Vpass | Vread | Vread | Vss |
| Control gate electrode CGb (First layer) | Vpass | Vpass | Vread | Vread | Vss |
| Back-gate BG | Von | | Von | | Von |
| Control gate electrode CGs (First layer) | Vpass | Vpass | Vread | Vread | Vss |
| Control gate electrode CGs (Second layer) | Vpass | Vpass | Vread | Vread | Vss |
| Control gate electrode CGs (Third layer) | Vpass | Vpass | Vread | Vread | Vss |
| Control gate electrode CGs (Fourth layer) | Vpass | Vpass | Vread | Vread | Vss |
| Selection gate electrode SGs | Voff | Voff | Von | Voff | Vsg |
| Source line SL | Vdd | Vdd | Vss | Vss | Verase |

FIG. 9

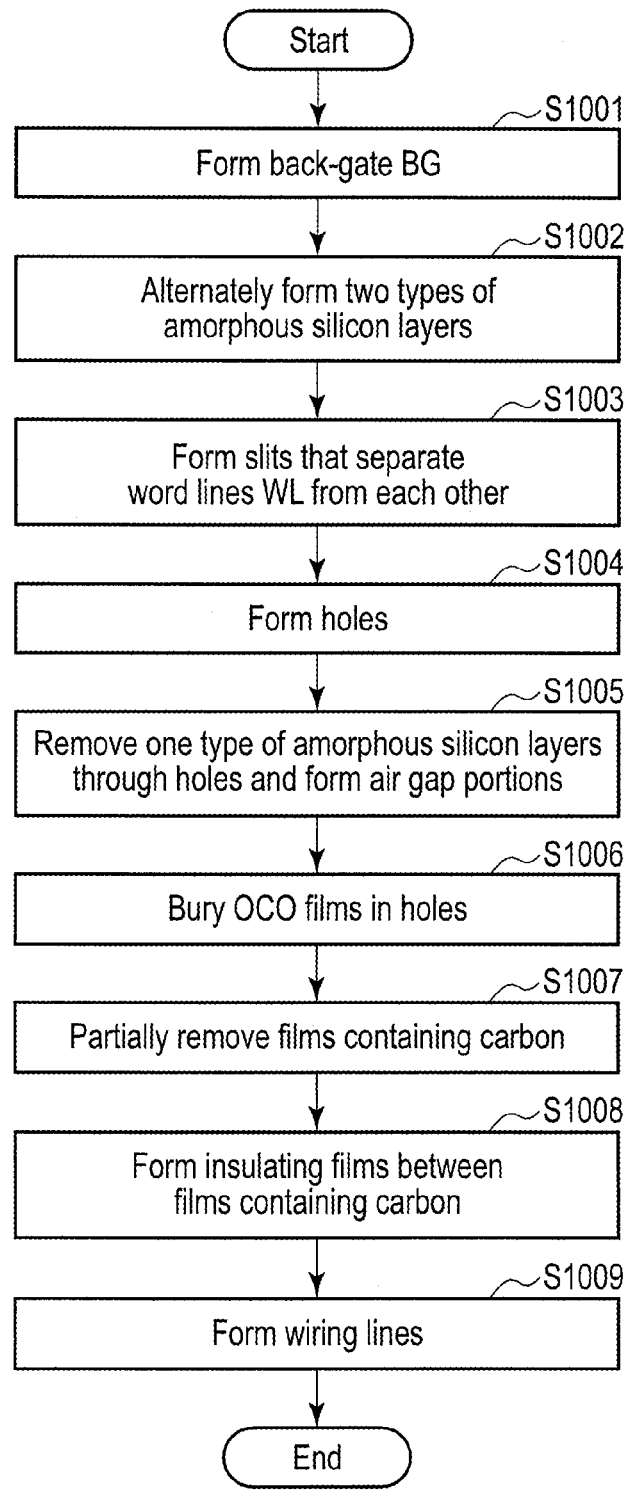
F I G. 10

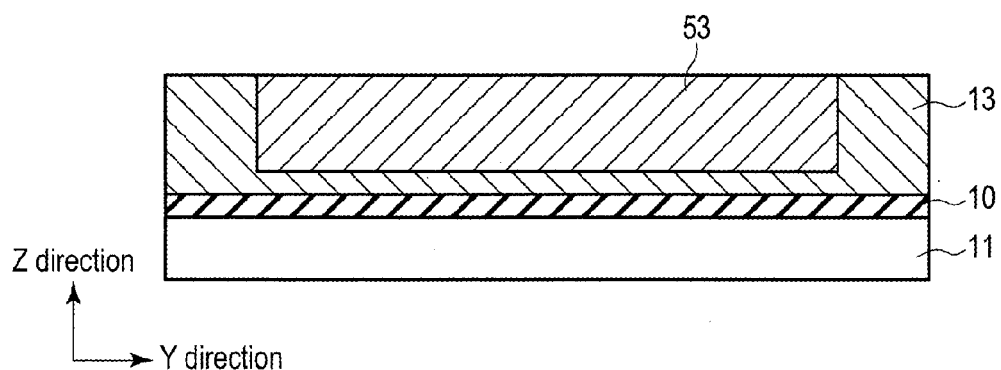
F I G. 13A
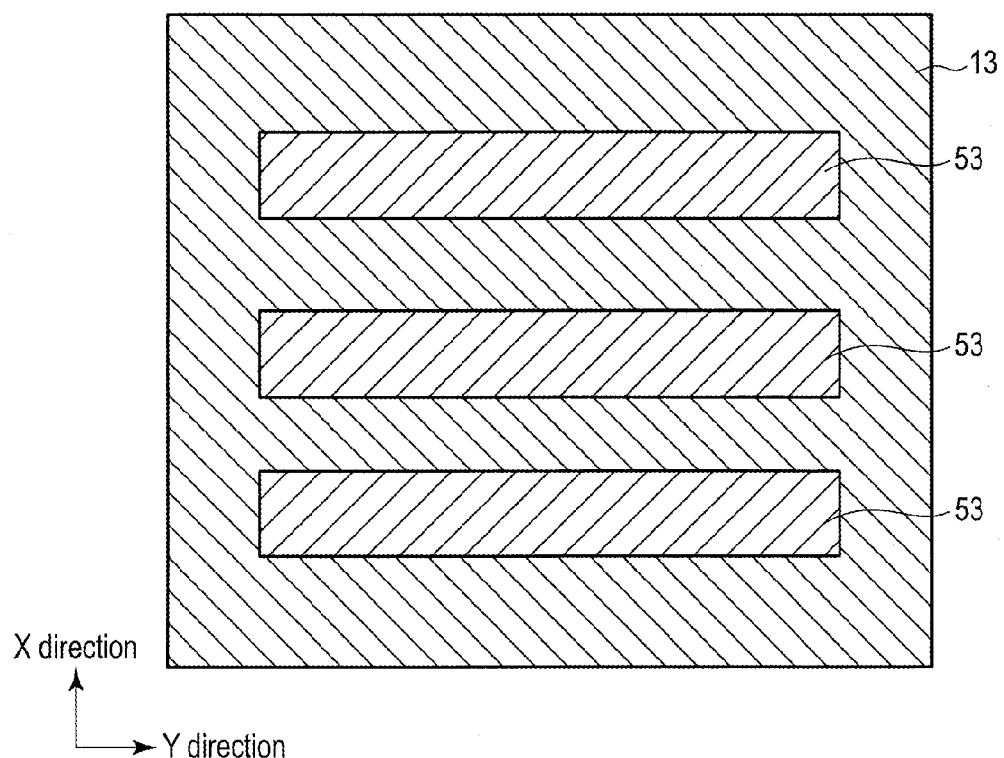
F I G. 13B

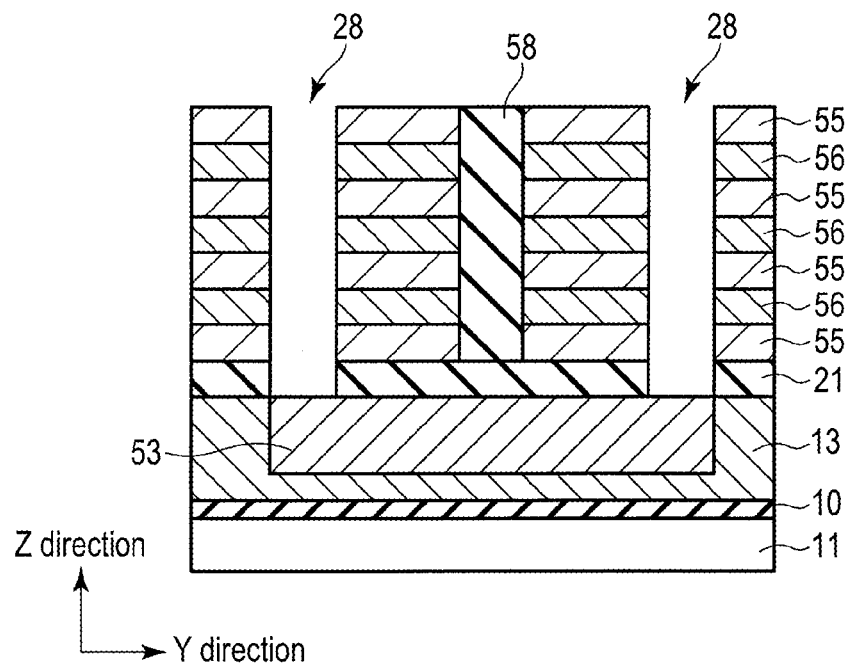
F I G. 16A
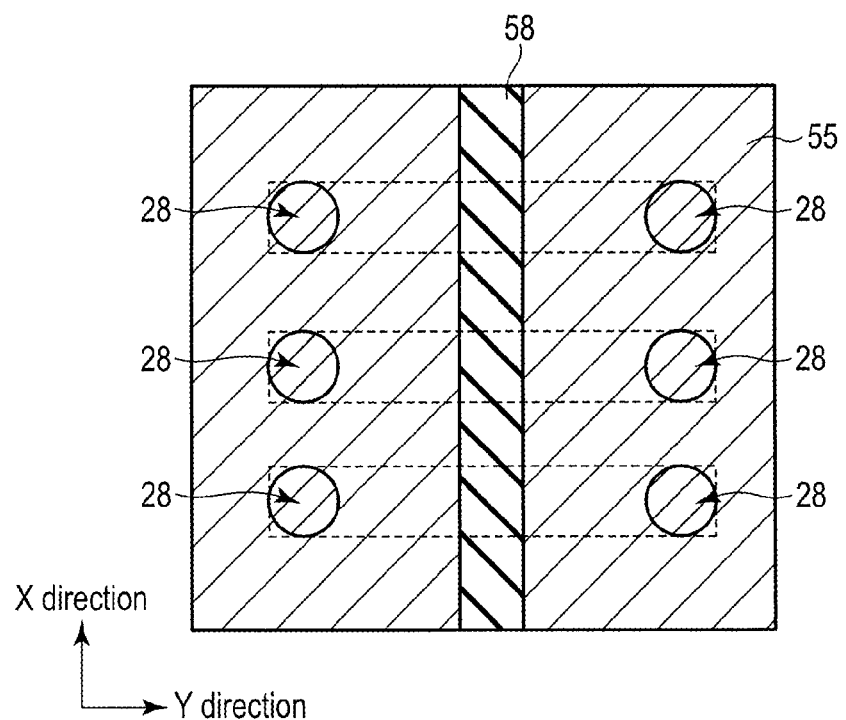
F I G. 16B

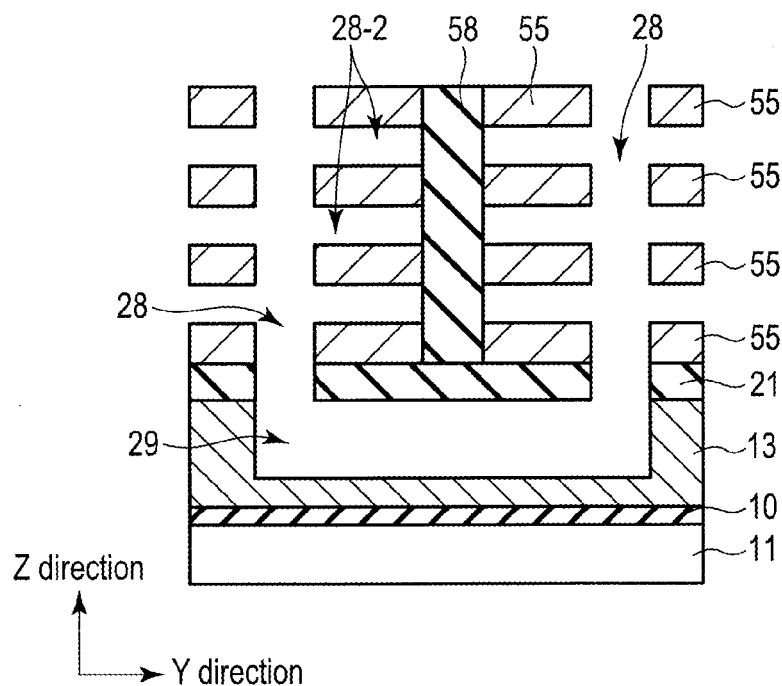
F I G. 17A
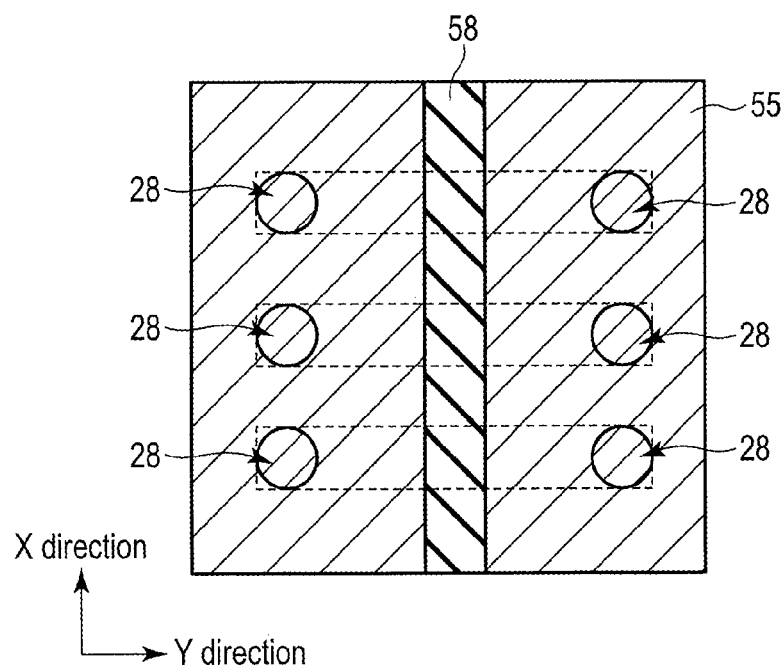
F I G. 17B

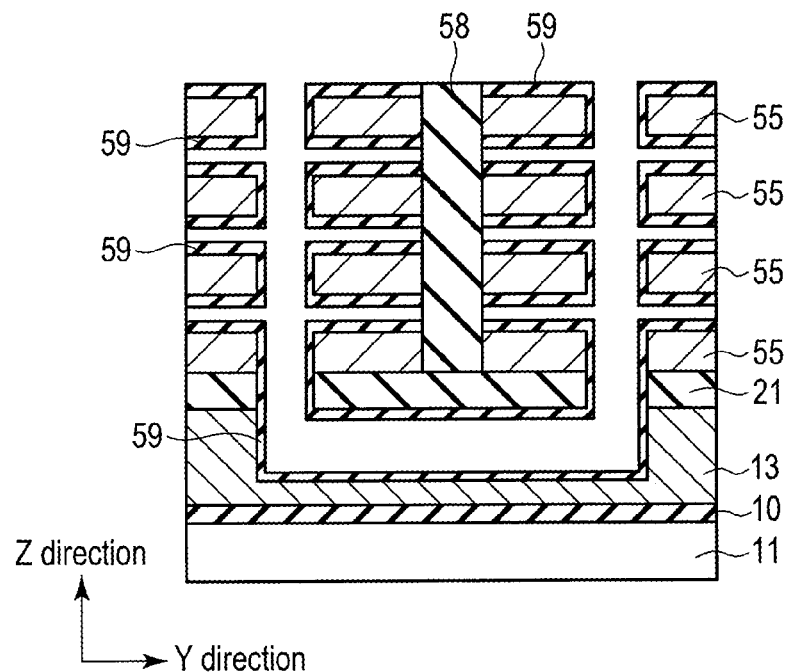
F I G. 18A
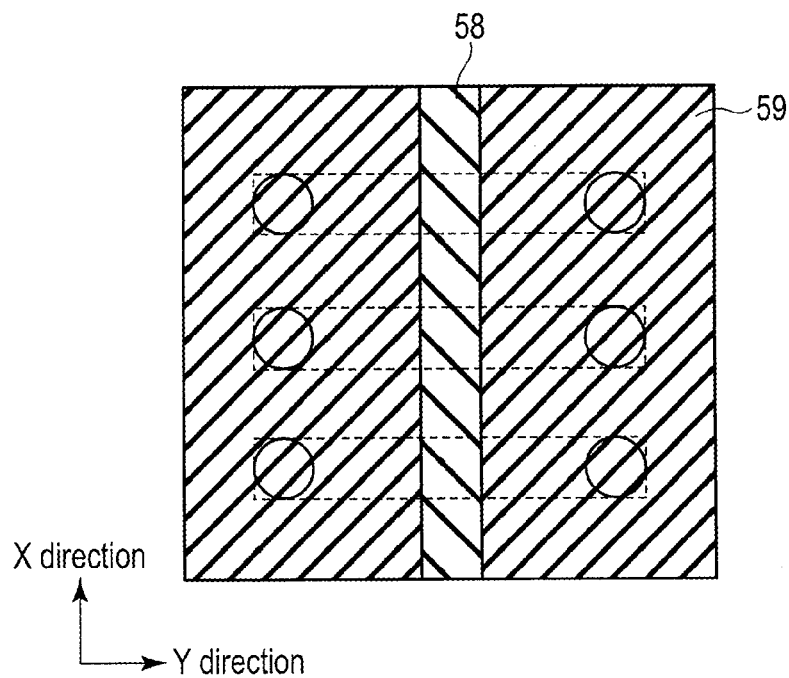
F I G. 18B

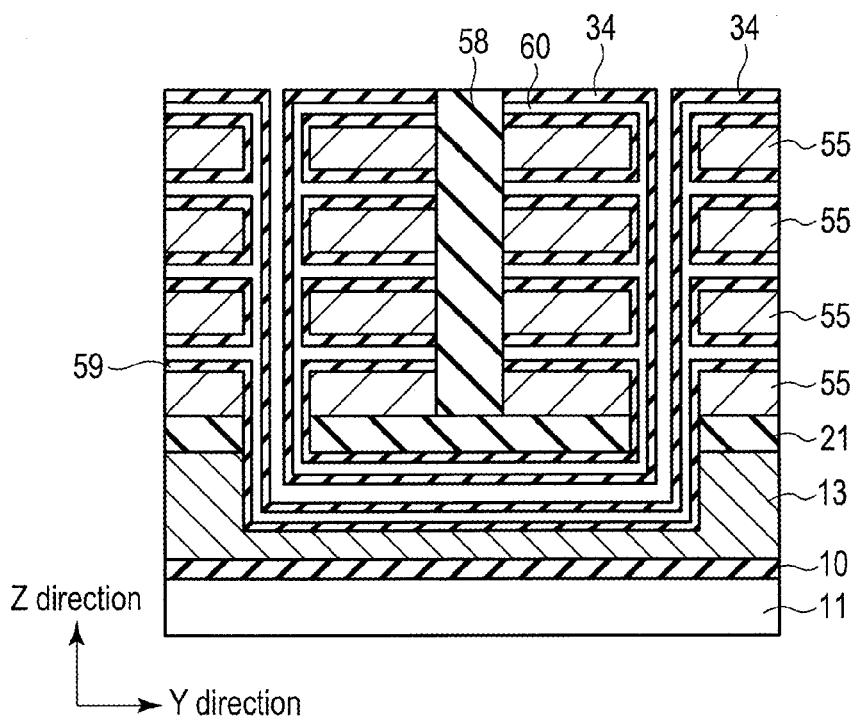
F I G. 20A
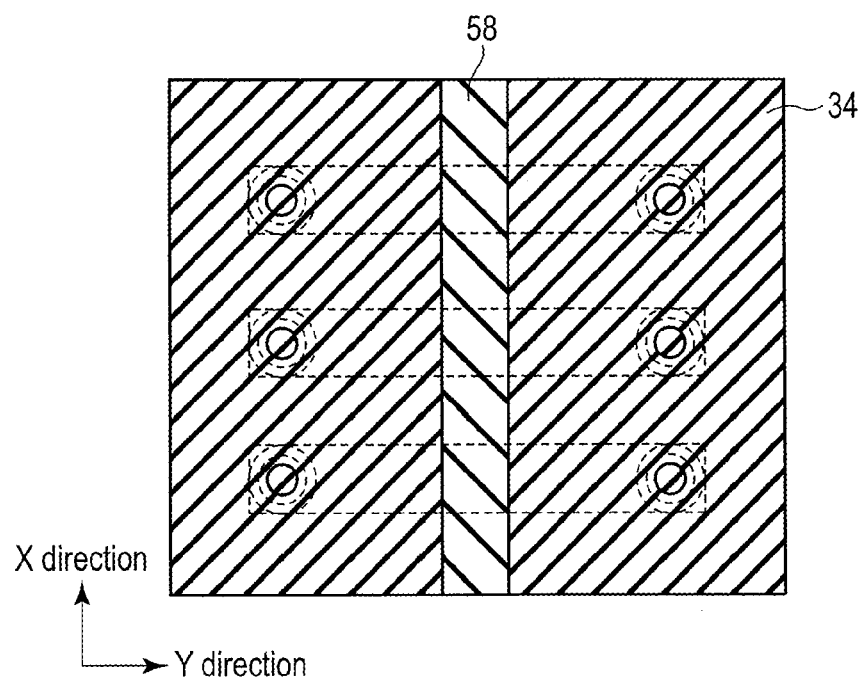
F I G. 20B

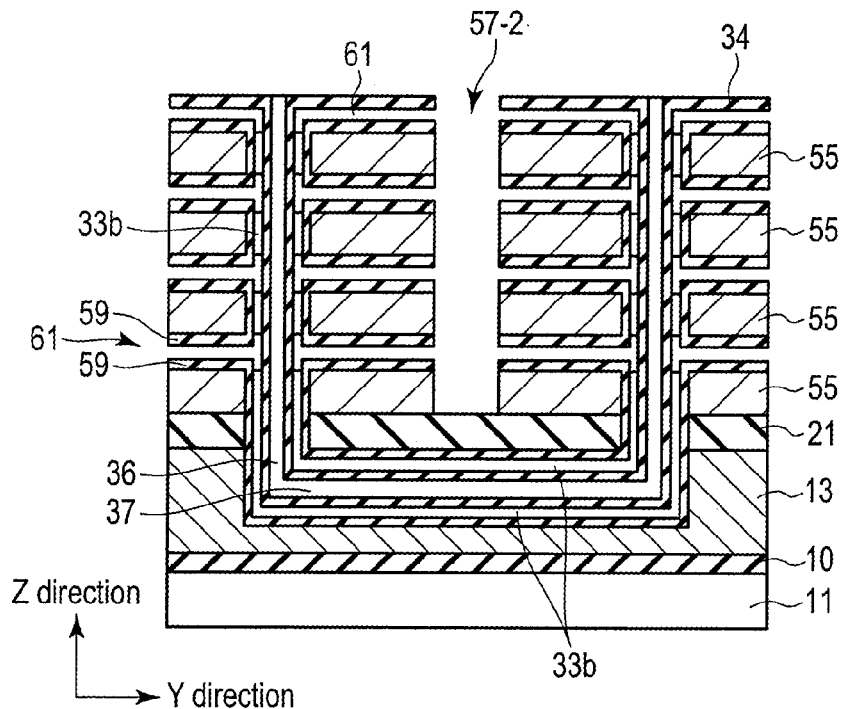
F I G. 22A
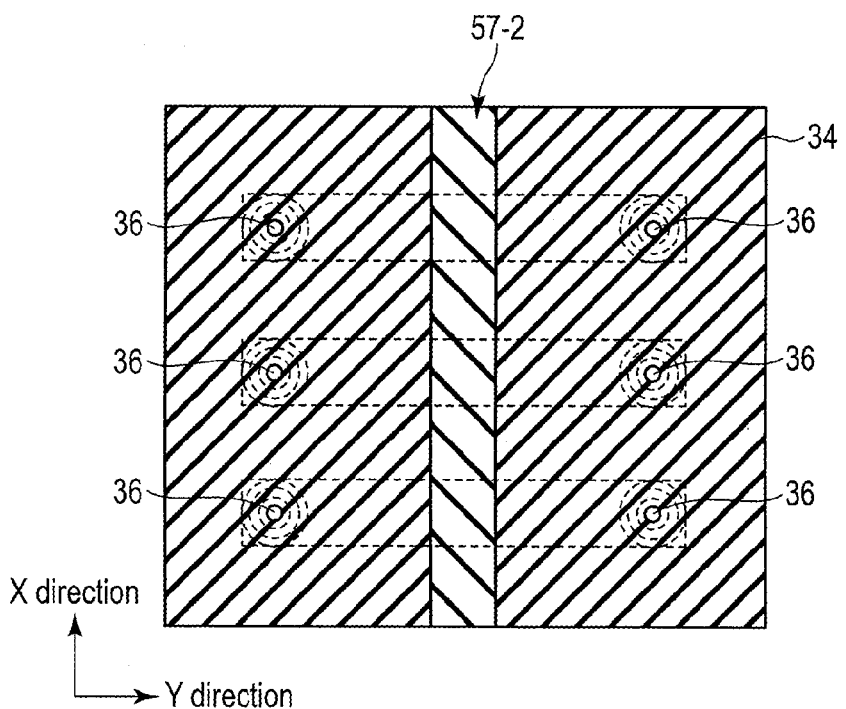
F I G. 22B

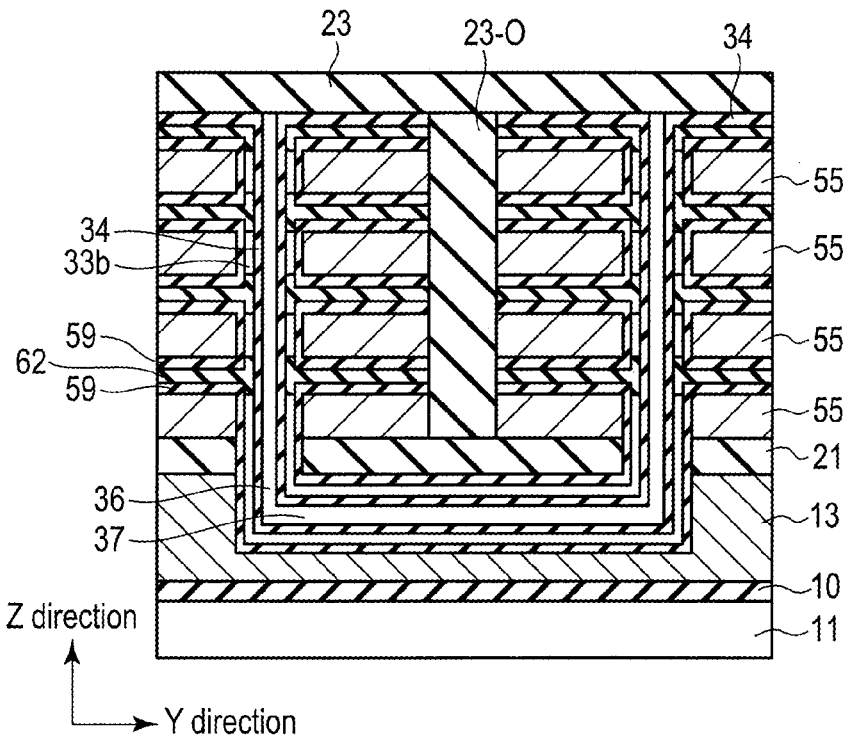
F I G. 23A
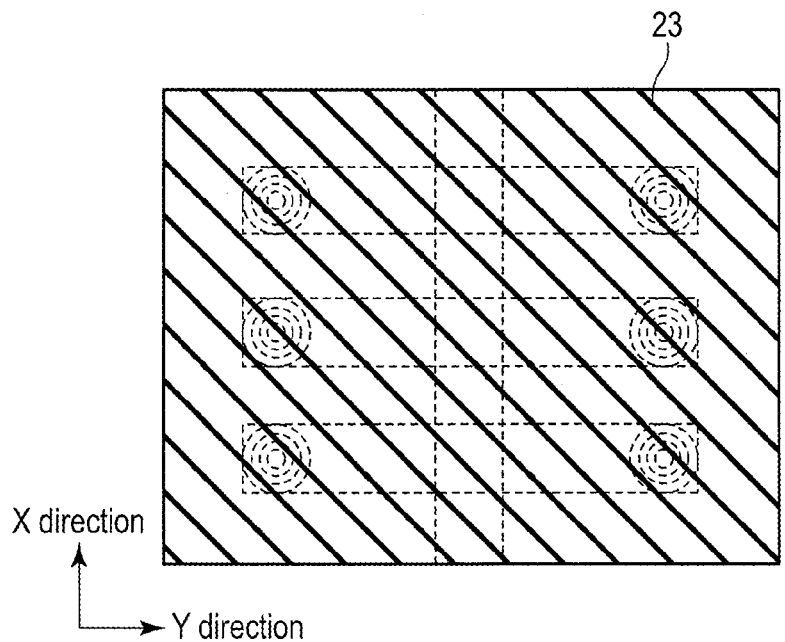
F I G. 23B

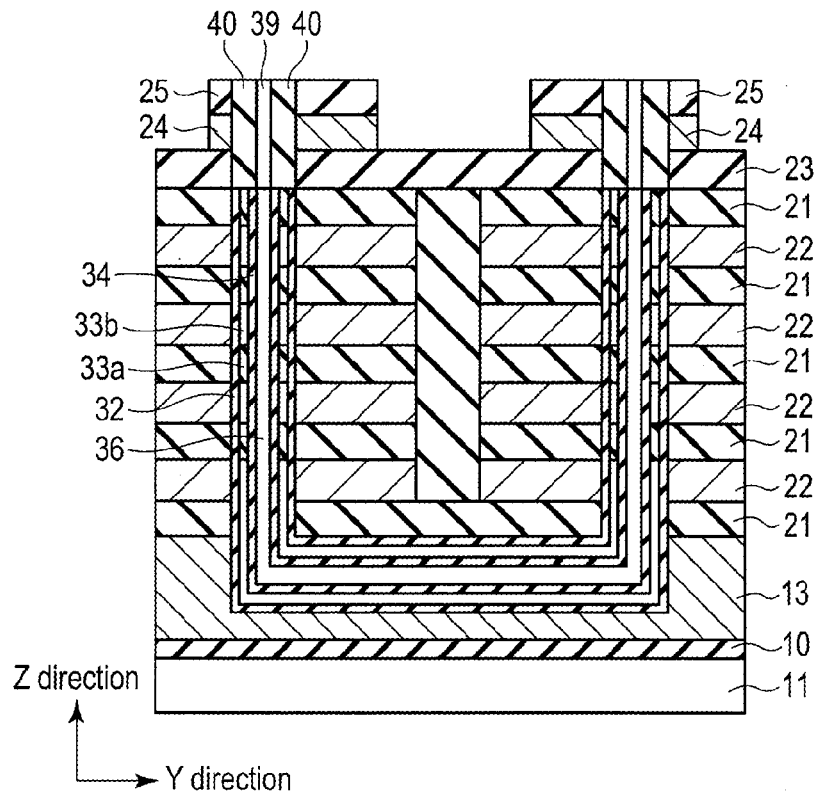
F I G. 25A
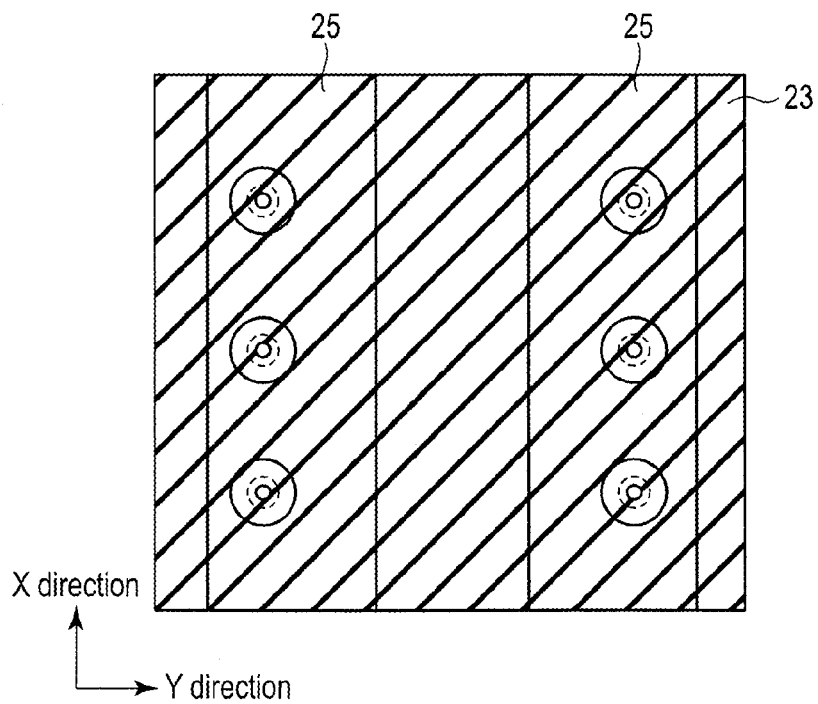
F I G. 25B

Preferred composition range
[at. %]
| No. | H | C+N+O | Si |
|---|---|---|---|
| 1 | 10 | 90 | 0 |
| 2 | 30 | 70 | 0 |
| 3 | 50 | 50 | 0 |
| 4 | 30 | 35 | 35 |
| 5 | 20 | 45 | 35 |
| 6 | 10 | 55 | 35 |
| 7 | 15 | 35 | 50 |
| 8 | 10 | 40 | 50 |
| 9 | 20 | 50 | 30 |
| 10 | 40 | 45 | 15 |
| 11 | 10 | 60 | 30 |
| 12 | 30 | 15 | 65 |
| 13 | 65 | 20 | 15 |
F I G. 26
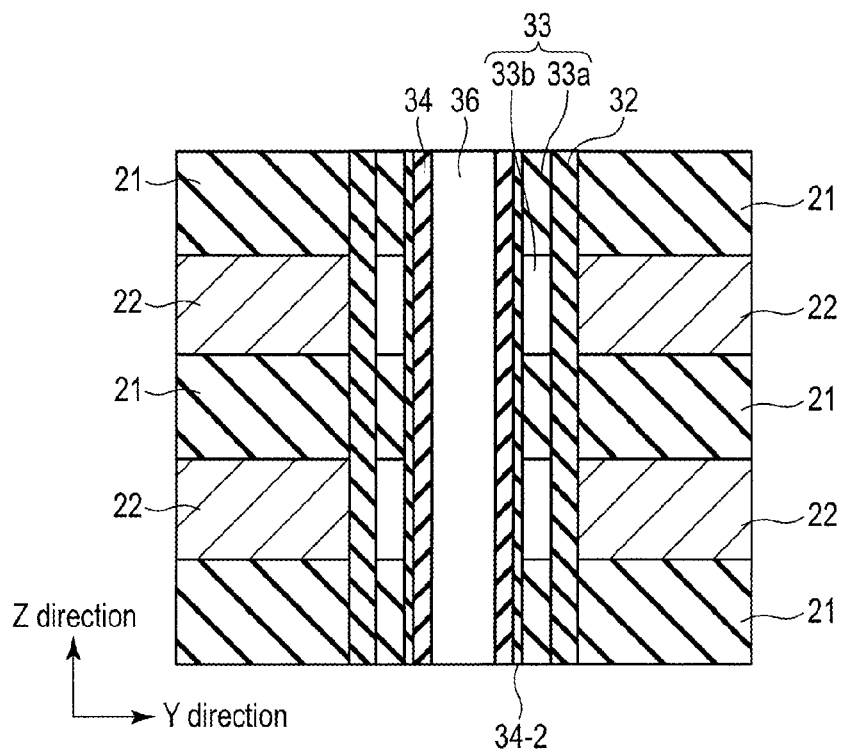
F I G. 27

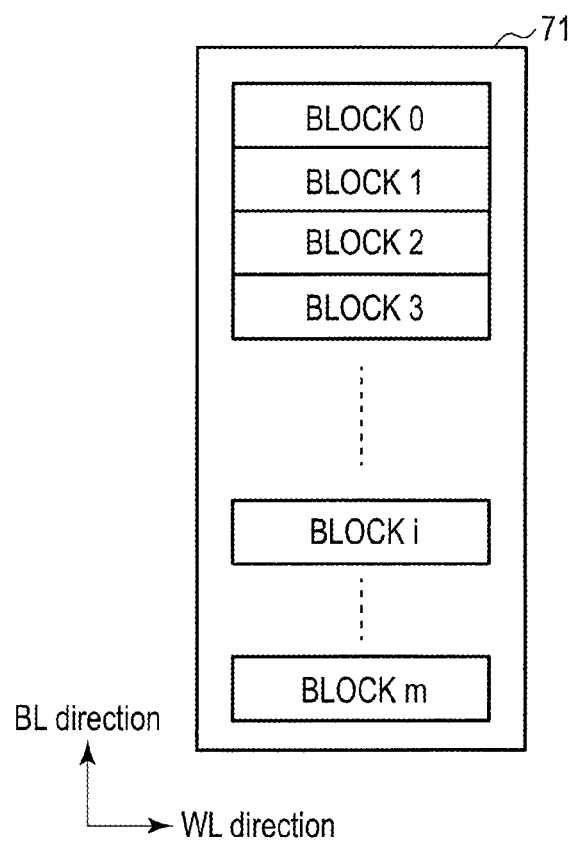
F I G. 31

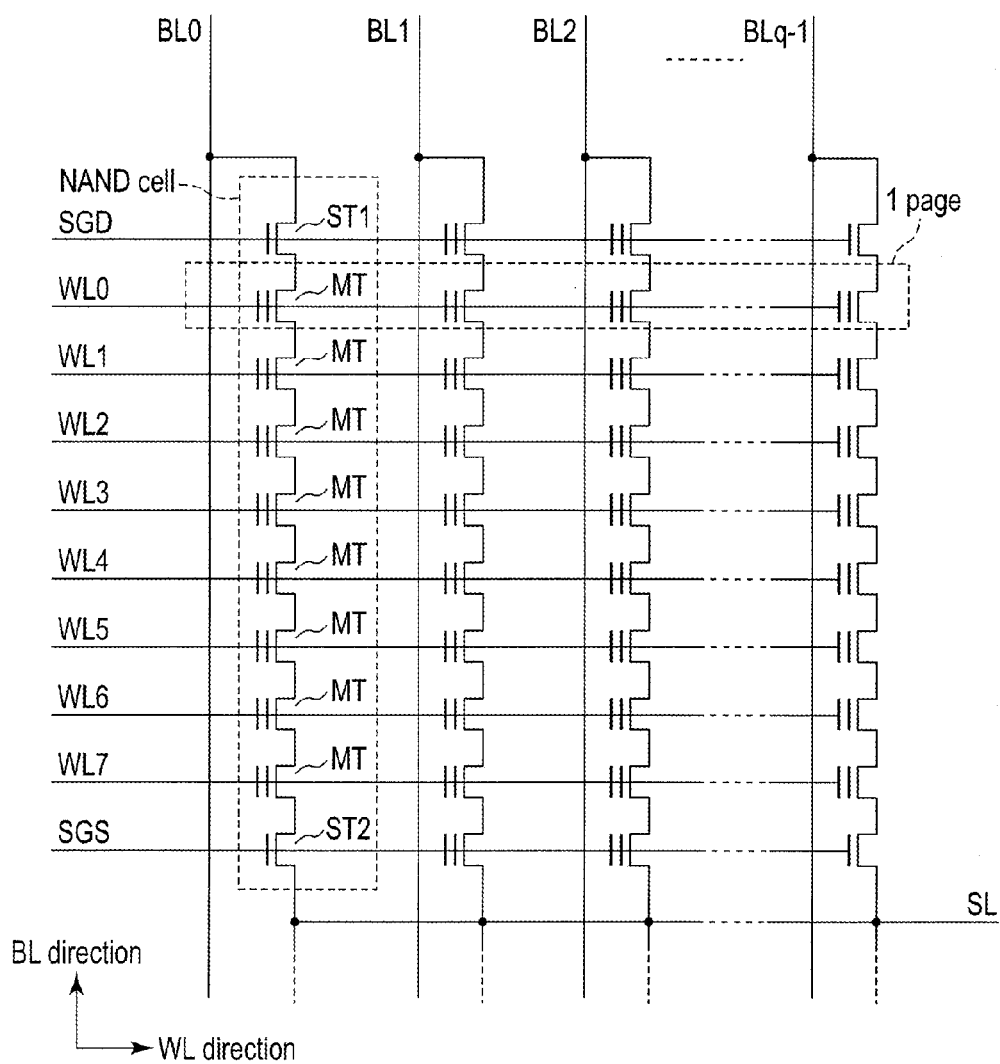
F I G. 32

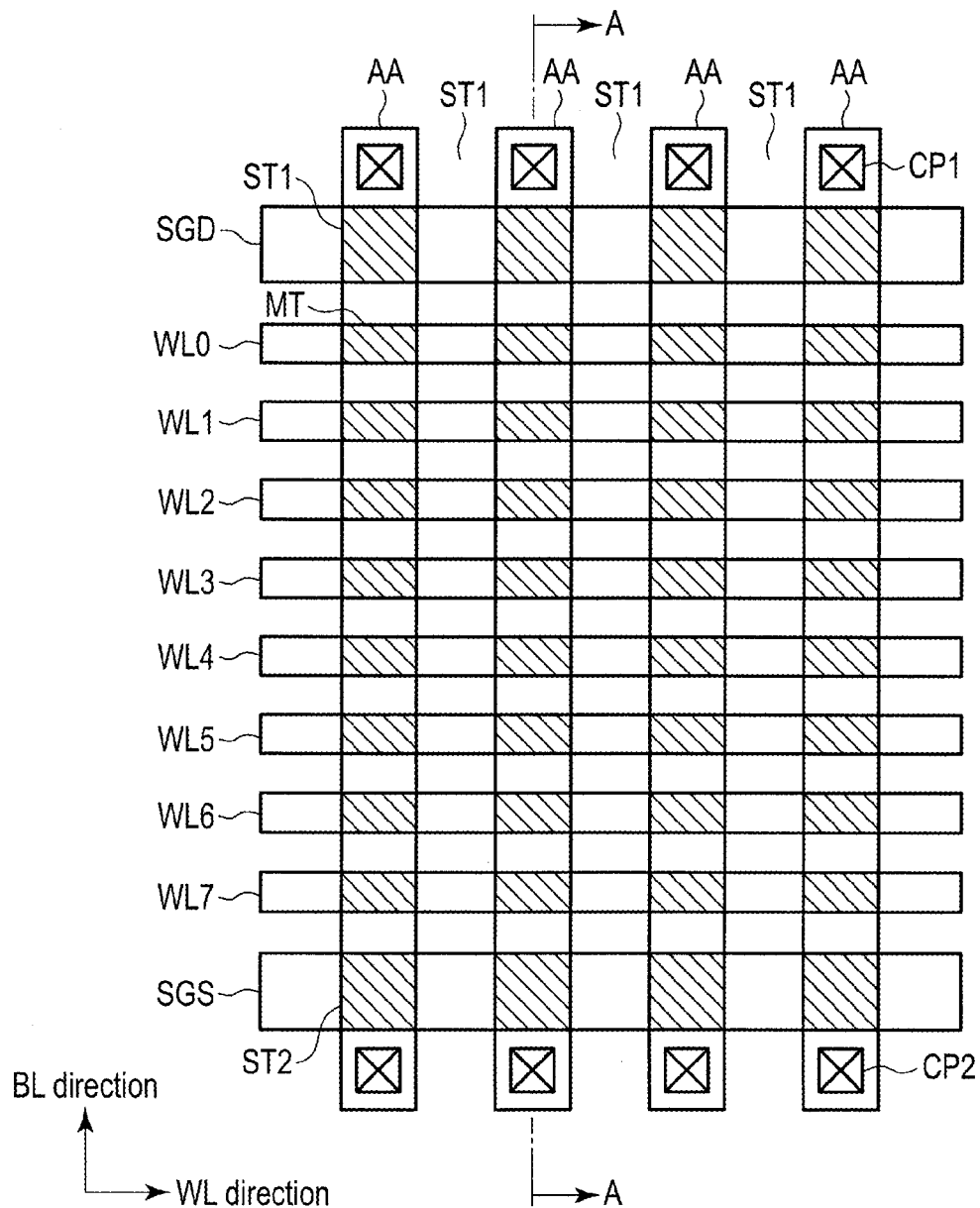
F I G. 33

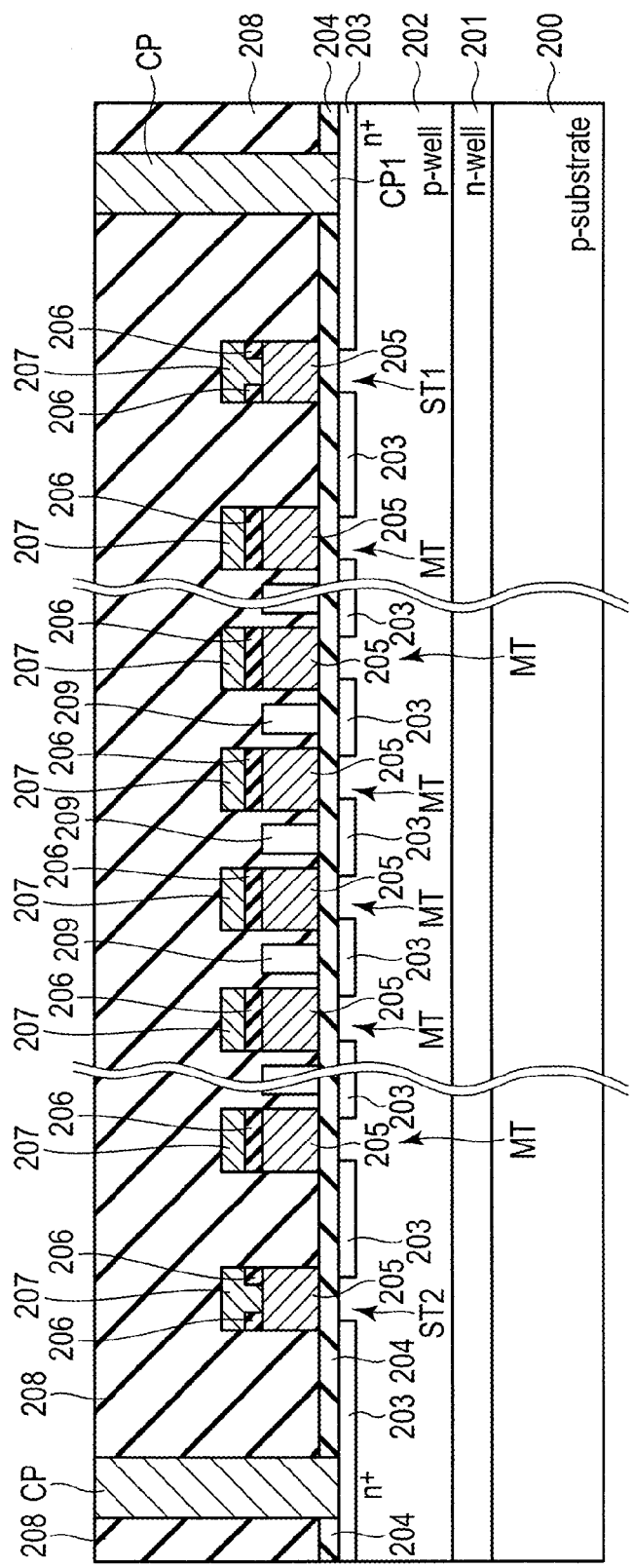
F I G. 34

NONVOLATILE SEMICONDUCTOR MEMORY DEVICE

CROSS-REFERENCE TO RELATED APPLICATIONS

This application is based upon and claims the benefit of priority from Japanese Patent Application No. 2012-066386, filed Mar. 22, 2012, the entire contents of which are incorporated herein by reference.

FIELD

Embodiments described herein relate generally to a nonvolatile semiconductor memory device.

BACKGROUND

To enhance a degree of integration of memory cell transistors, a semiconductor memory device having three-dimensionally arranged memory cells has been recently proposed.

As one of conventional semiconductor memory devices having three-dimensionally arranged memory cells, there is a semiconductor memory device that uses transistors each having an SGT (Surround Gate transistor: cylindrical) structure. In the semiconductor memory device using transistors each having the SGT structure, multilayer polysilicon that serves as a gate electrode and a pillar-like columnar semiconductor are provided. The columnar semiconductor functions as a channel (body) portion of each transistor. Charge storage layers which are provided through tunnel insulating layers and store electric charges are provided around the columnar semiconductor. Further, block insulating layers are formed around the charge storage layers. A configuration including the polysilicon, the columnar semiconductor, the tunnel insulating layers, the charge storage layers, and the block insulating layers is called a memory string.

BRIEF DESCRIPTION OF THE DRAWINGS

FIG. 3 is a perspective view schematically showing the basic configuration of the nonvolatile semiconductor memory device according to the first embodiment;

FIG. 4 is a cross-sectional view schematically showing the basic configuration of the nonvolatile semiconductor memory device according to the first embodiment;

FIG. 5 is a cross-sectional view schematically showing a basic configuration of a memory cell transistor according to the first embodiment;

FIG. 6 is a circuit diagram schematically showing the basic configuration of the nonvolatile semiconductor memory device according to the first embodiment;

FIG. 9 is a view showing potentials applied to each electrode and each wiring line in operations of the nonvolatile semiconductor memory device according to the first embodiment;

FIG. 10 is a flowchart schematically showing a manufacturing method of the nonvolatile semiconductor memory device 100 according to this embodiment;

FIG. 13A is a cross-sectional view taken along the Z-Y plane which illustrates the basic manufacturing method of the nonvolatile semiconductor memory device according to the first embodiment, and FIG. 13B is a plan view taken along the X-Y plane which illustrates the basic manufacturing method of the nonvolatile semiconductor memory device according to the first embodiment;

FIG. 16A is a cross-sectional view taken along the Z-Y plane which illustrates the basic manufacturing method of the nonvolatile semiconductor memory device according to the first embodiment, and FIG. 16B is a plan view taken along the X-Y plane which illustrates the basic manufacturing method of the nonvolatile semiconductor memory device according to the first embodiment;

FIG. 17A is a cross-sectional view taken along the Z-Y plane which illustrates the basic manufacturing method of the nonvolatile semiconductor memory device according to the first embodiment, and FIG. 17B is a plan view taken along the X-Y plane which illustrates the basic manufacturing method of the nonvolatile semiconductor memory device according to the first embodiment;

FIG. 18A is a cross-sectional view taken along the Z-Y plane which illustrates the basic manufacturing method of the nonvolatile semiconductor memory device according to the first embodiment, and FIG. 18B is a plan view taken along the X-Y plane which illustrates the basic manufacturing method of the nonvolatile semiconductor memory device according to the first embodiment;

FIG. 20A is a cross-sectional view taken along the Z-Y plane which illustrates the basic manufacturing method of the nonvolatile semiconductor memory device according to the first embodiment, and FIG. 20B is a plan view taken along the X-Y plane which illustrates the basic manufacturing method of the nonvolatile semiconductor memory device according to the first embodiment;

FIG. 22A is a cross-sectional view taken along the Z-Y plane which illustrates the basic manufacturing method of the nonvolatile semiconductor memory device according to the first embodiment, and FIG. 22B is a plan view taken along the X-Y plane which illustrates the basic manufacturing method of the nonvolatile semiconductor memory device according to the first embodiment;

FIG. 23A is a cross-sectional view taken along the Z-Y plane which illustrates the basic manufacturing method of the nonvolatile semiconductor memory device according to the first embodiment, and FIG. 23B is a plan view taken along the X-Y plane which illustrates the basic manufacturing method of the nonvolatile semiconductor memory device according to the first embodiment;

FIG. 25A is a cross-sectional view taken along the Z-Y plane which illustrates the basic manufacturing method of the nonvolatile semiconductor memory device according to the first embodiment, and FIG. 25B is a plan view taken along the X-Y plane which illustrates the basic manufacturing method of the nonvolatile semiconductor memory device according to the first embodiment;

FIG. 26 is a table showing a range of preferred compositions of a thin film mainly containing carbon which is a charge storage film;

FIG. 27 is a cross-sectional view showing part of a basic manufacturing process of a nonvolatile semiconductor memory device according to a third embodiment;

FIG. 31 is a block diagram schematically showing a basic configuration of a memory cell array according to the fourth embodiment;

FIG. 32 shows a circuit example of one memory block in memory blocks depicted in FIG. 31;

FIG. 33 is a plan view schematically showing a basic configuration of the memory cell array according to the fourth embodiment; and FIG. 34 is a cross-sectional view taken along a line A-A in FIG. 33.

DETAILED DESCRIPTION

Figure 1:
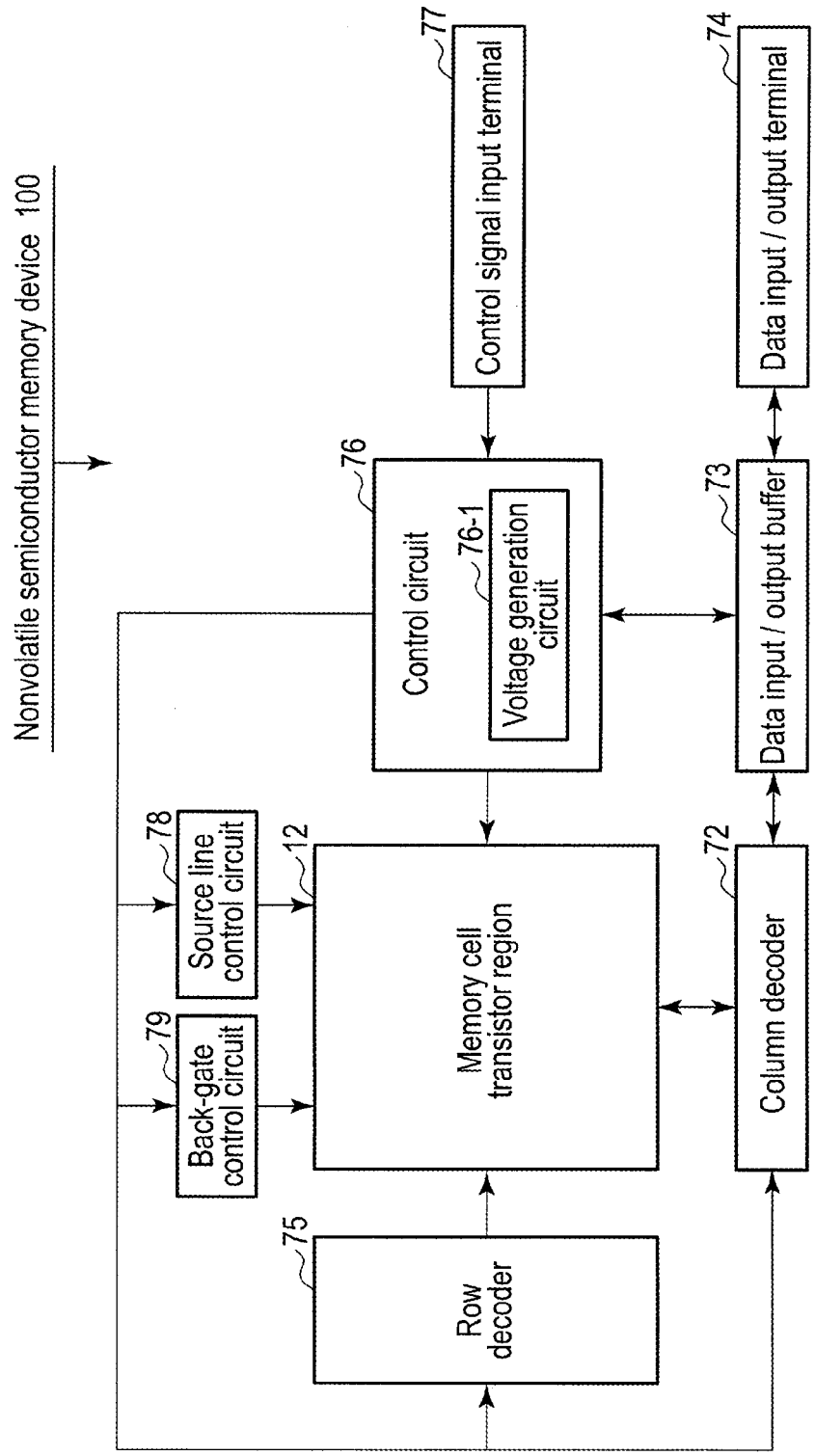
FIG. 1 is a block diagram schematically showing a basic configuration of a nonvolatile semiconductor memory device according to a first embodiment.

In general, according to one embodiment, there is provided a nonvolatile semiconductor memory device including:

a substrate;

a laminated film which has a configuration where first insulating layers and first electrode layers are alternately laminated in a first direction vertical to the substrate;

a second insulating layer formed on an inner wall of a first through hole pierced in the first insulating layers and the first electrode layers along the first direction;

an intermediate layer formed on a surface of the second insulating layer;

a third insulating layer formed on a surface of the intermediate layer; and a pillar-like first semiconductor region which is formed on a surface of the third insulating layer and extends along the first direction, wherein the intermediate layer comprises: charge storage regions which mainly contain carbon at positions where the charge storage regions are adjacent to the first electrode layer in a second direction orthogonal to the first direction; and insulating regions which electrically separate the charge storage regions adjacent to each other along the first direction at positions where the insulating regions are adjacent to the first insulating layer in the second direction.

An embodiment will now be described hereinafter with reference to the accompanying drawings. It is to be noted that, in the following description, constituent elements having substantially the same functions and configurations are denoted by like reference numerals, and an overlapping description will be given only when necessary. Each embodiment described below illustrates a device or a method that embodies the technical concept of the embodiment, and the technical concept of each embodiment does not restrict a material, a shape, a structure, arrangement, and others of each constituent component to the following. The technical concept of each embodiment can be changed in many ways within the scope of the claims.

Furthermore, the drawings are of a schematic type, and it should be noted that a relationship between a thickness and a planar dimension, a ratio of a thickness of each layer, and the like are different from actual values. Therefore, specific thicknesses or dimensions should be determined while taking the following description into consideration. Moreover, as a matter of course, the drawings include portions with different dimensional relationships or ratios.

First Embodiment

A nonvolatile semiconductor memory device according to a first embodiment will now be described hereinafter.

<1.1 Configuration>
<1.1.1 Entire Configuration of Structure of Nonvolatile Semiconductor Memory Device>

FIG. 1 is a block diagram showing a nonvolatile semiconductor memory device according to a first embodiment.

As shown in FIG. 1, a three-dimensional laminated NAND flash memory 100 includes a memory cell transistor region 12, a column decoder 2, a data input/output buffer 3, a data input/output terminal 4, a row decoder, a control circuit 6, a control signal input terminal 7, a source line control circuit 8, and a back-gate control circuit 9.

The memory cell transistor region 12 includes blocks. Each of the blocks includes word lines WL, bit lines, and memory cells arranged in a matrix shape.

The column decoder 2 has a sense amplifier (not shown) that performs sense amplification with respect to a voltage in each bit line BL in the memory cell transistor region 12, a data memory circuit (not shown) configured to latch data to be written, and others. The column decoder 2 reads data in each memory cell MT in the memory cell transistor region 12 through each bit line BL, detects a state of each memory cell MT through each bit line BL, or applies a write control voltage to each memory cell MT through each bit line BL to write data into this memory cell MT.

Further, the column decoder 2 selects the data memory circuit in the column decoder 2 and outputs data in a given memory cell MT read to this data memory circuit from the data input/output terminal 4 to the outside (a host) through the data input/output buffer 3.

The data input/output buffer 3 receives data from the data input/output terminal 4, and the data is stored in the data memory circuit selected by the column decoder 2. Furthermore, the data input/output buffer 3 outputs the data to the outside through the data input/output terminal 4.

The data input/output terminal 4 receives various kinds of commands such as write, read, erase, status read, and others, and addresses besides write data.

The row decoder 5 selects any block BLK at a time of a data read operation, a data write operation, or a data erase operation, and sets the remaining blocks BLK to a non-selected state. That is, the row decoder 5 applies a voltage required for the read operation, the write operation, or the erase operation to each word line WL and selection gate lines VSGS and VSGD of the memory cell array 1.

The source line control circuit 8 is connected to the memory cell transistor region 12. The source line control circuit 8 controls a voltage in each source line SL.

The back-gate control circuit 9 is connected to a later-described back-gate BG in the later-described memory cell transistor region 12 and controls a voltage that is applied to the back-gate BG.

The control circuit 6 controls the memory cell transistor region 12, the column decoder 2, the data input/output buffer 3, the row decoder 5, the source line control circuit 8, and the back-gate control circuit 9. It is assumed that the control circuit 6 includes a voltage generation circuit 6-1 that boosts, e.g., a power supply voltage. The control circuit 6 boosts the power supply voltage by using the voltage generation circuit 6-1 as required and applies the boosted voltage to the column decoder 2, the data input/output buffer 3, the row decoder 5, the source line control circuit 8, and the back-gate control circuit 9.

The control circuit 6 performs control operations in accordance with each control signal input from the outside through the control signal input terminal 7 (a command latch enable signal CLE, an address latch enable signal ALE, a ready/busy signal RY/BY, or the like) and each command input from the data input/output terminal 4 through the data input/output buffer 3. That is, the control circuit 6 generates a desired voltage in accordance with the control signal and each command at a time of programming, verifying, reading, or erasing data, and supplies this voltage to each portion in the memory cell transistor region 12.

Figure 2:
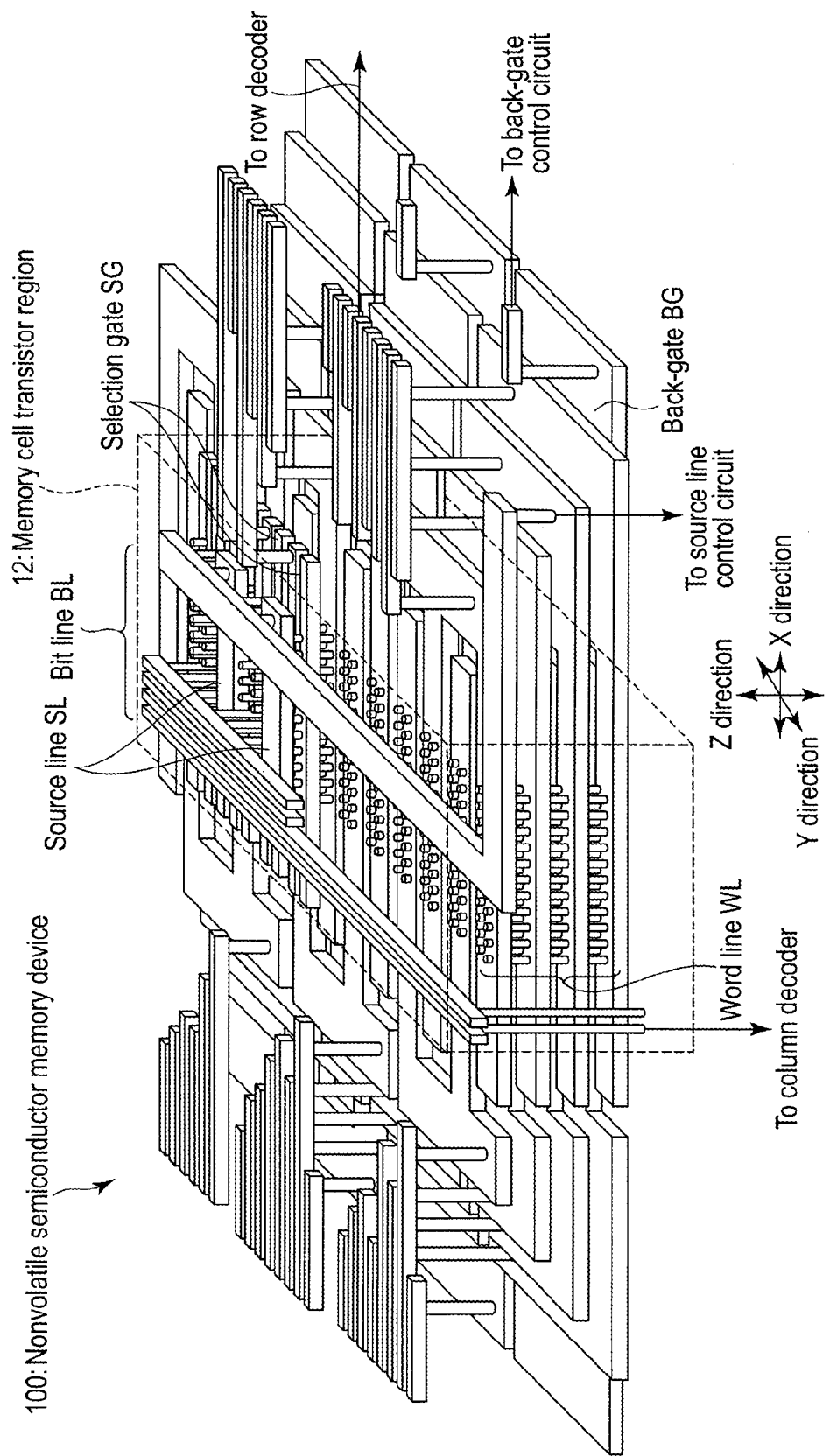
FIG. 2 is a bird's-eye view schematically showing the basic configuration of the nonvolatile semiconductor memory device according to the first embodiment.

FIG. 2 is a bird's-eye view schematically showing a basic configuration of the nonvolatile semiconductor memory device according to the first embodiment.

As shown in FIG. 2, the nonvolatile semiconductor memory device (the three-dimensional laminated NAND flash memory) 100 includes the memory cell transistor region 12, the word lines WL, the selection gates SG, the source lines SL, and the back-gate BG, and others.

It is to be noted that, as an example of this embodiment, the control circuit is arranged outside the memory cell transistor region 12 (the memory cell array).

In the memory cell transistor region 12, the word lines WL, the bit lines BL, the source lines SL, the back-gate BG, and the selection gates SG are provided. In this memory cell transistor region 12, a memory cell transistor that stores data is arranged at each of intersecting positions of the laminated word lines WL and a later-described U-shaped silicon pillar SP. It is to be noted that FIG. 2 shows an example where the four word lines WL are laminated, but the present embodiment is not restricted thereto.

The row decoder 5 is connected to the word lines WL and controls a voltage applied to each of the word lines WL. Additionally, all wiring lines that connect the row decoder 5 to the word lines WL are formed in wiring layers on the same level, but the present embodiment is not restricted thereto, and the wiring lines may be formed in wiring layers on different levels. Further, the non-illustrated column decoder 2 controls a voltage that is applied to each of the bit lines BL.

The source line control circuit 8 is connected to the source lines SL and controls a voltage that is applied to each of the source lines SL. This source line control circuit 8 is connected to all the source lines SL, but the present embodiment is not restricted thereto, and each source line control circuit 8 may be provided for each source line SL.

The back-gate control circuit 9 is connected to the back-gate BG and controls a voltage applied to the back-gate BG.

<1.1.2 Configuration of Memory Cell Transistor Region>

The memory cell transistor region 12 will now be described in detail.

FIG. 3 is a perspective view showing a nonvolatile semiconductor memory device according to this embodiment, and FIG. 4 is a cross-sectional view illustrating the nonvolatile semiconductor memory device according to this embodiment. Furthermore, FIG. 5 is a cross-sectional view schematically showing a basic configuration of the memory cell transistor according to this embodiment, and FIG. 6 is a circuit diagram illustrating the nonvolatile semiconductor memory device according to this embodiment. Moreover, FIG. 7 is another cross-sectional view illustrating the nonvolatile semiconductor memory device according to this embodiment, and FIG. 8 is a plan view illustrating the nonvolatile semiconductor memory device according to this embodiment.

Figure 7:
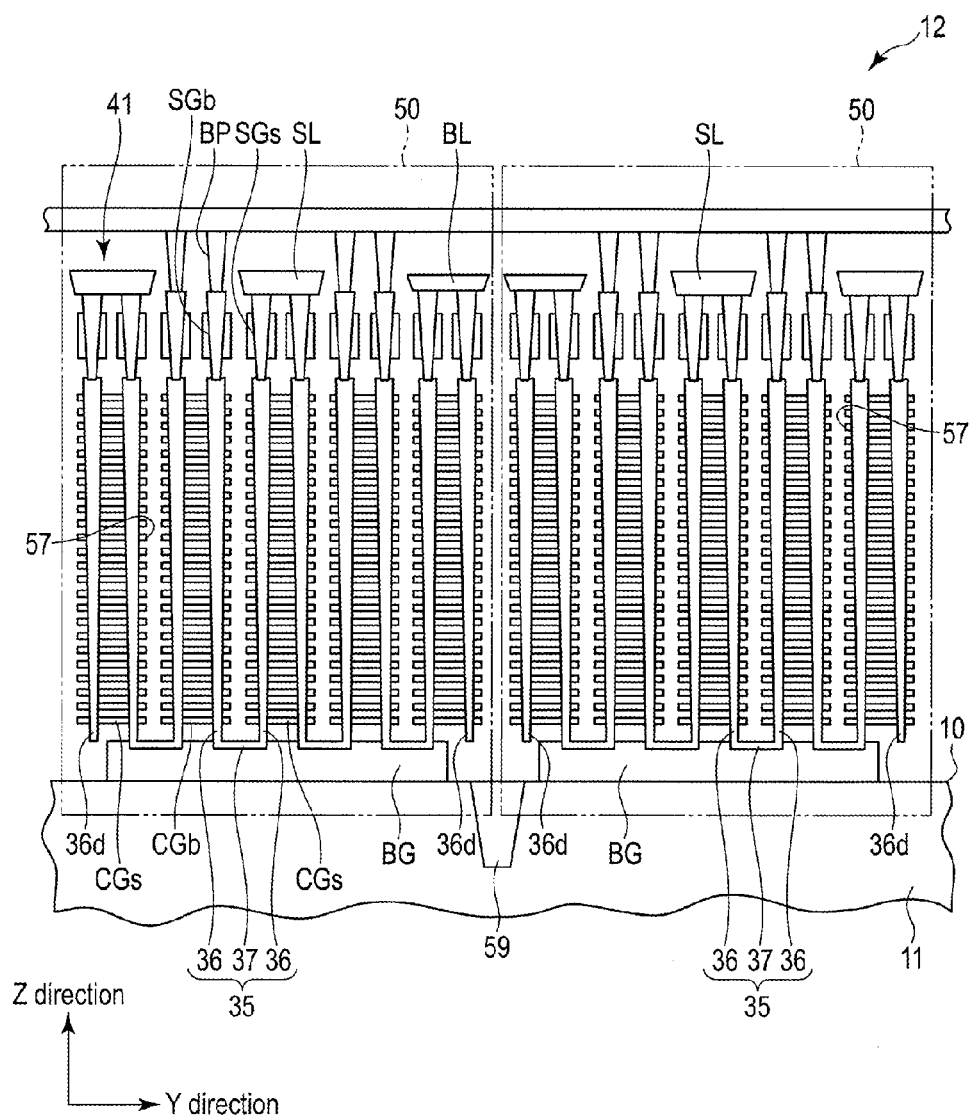
FIG. 7 is another cross-sectional view schematically showing the basic configuration of the nonvolatile semiconductor memory device according to the first embodiment.
Figure 8:
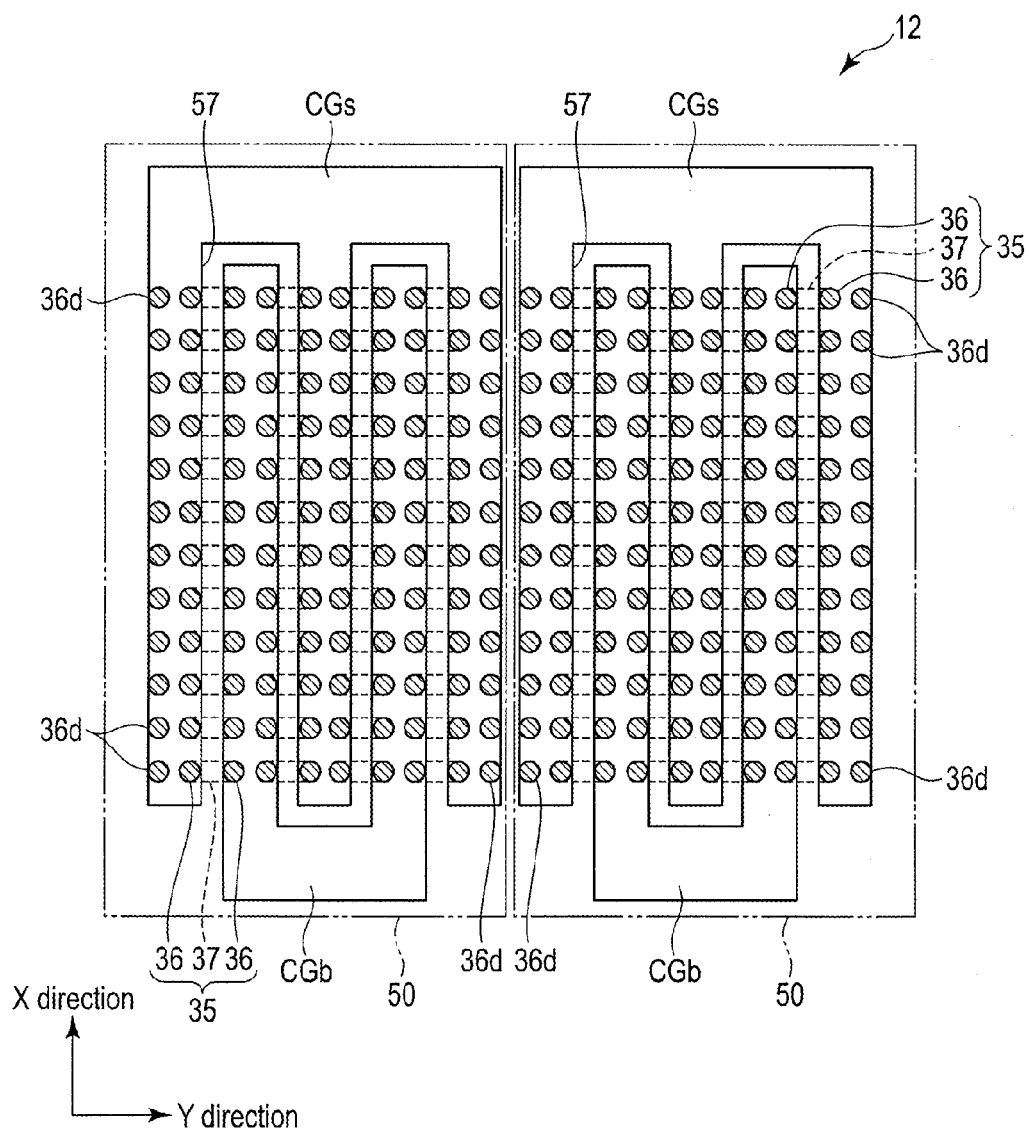
FIG. 8 is a plan view schematically showing the basic configuration of the nonvolatile semiconductor memory device according to the first embodiment.

It is to be noted that FIG. 7 shows an example where 24 control gate electrode layers are provided, but each of FIG. 3 to FIG. 6 shows four control gate electrode layers alone for ease of illustration. Additionally, in each of FIG. 3, FIG. 7, and FIG. 8, a silicon substrate and a conductive portion alone are shown for ease of illustration, and an insulating portion is omitted in these drawings. In particular, FIG. 8 shows the silicon substrate, the back-gate, the control gate electrodes, and the U-shaped silicon member alone. Further, FIG. 6 shows a pair of memory strings that share the control gate electrodes.

In the nonvolatile semiconductor memory device according to this embodiment, each U-shaped pillar is formed of a pair of silicon pillars in a batch processing type three-dimensional laminated memory device having each memory transistor provided at each intersecting portion of the silicon pillar and a control gate electrode, two columns of silicon pillars pierce through each control gate electrode, one pair of silicon pillars constituting each U-shaped pillar pierce through control gate electrodes which are different from each other, the memory cell transistor region 12 is divided into blocks, and hence appropriate termination processing is carried out between a block end portion and each block. A configuration of this nonvolatile semiconductor memory device will now be described hereinafter in detail.

As shown in FIG. 3 and FIG. 4, in the nonvolatile semiconductor memory device according to this embodiment, for example, a silicon substrate 11 is provided. On the silicon substrate 11, a memory cell transistor region 12 where each memory cell transistor is formed and a peripheral circuit region (not shown) where each peripheral circuit is formed are composed. The peripheral circuit region is arranged around the memory cell transistor region 12. It is to be noted that the peripheral circuit region does not have to be arranged around the memory cell transistor region 12, and it may be provided below the memory cell transistor region 12, for example. In this case, the peripheral circuit region is formed on the silicon substrate 11, and the memory cell transistor region 12 is formed thereon.

In the memory cell transistor region 12, an insulating layer 10 is provided on the silicon substrate 11, and a conductive layer, e.g., a polysilicon film 13 is formed thereon. This forms a back-gate BG. On the back-gate BG, respective insulating layers 21 and respective electrode layers 22 are alternately laminated. Further, the respective insulating layers 21 and the respective electrode layers 22 constitute a laminated body (laminated film) ML.

In this specification, an XYZ orthogonal coordinate system will be introduced hereinafter. In this coordinate system, an X direction and a Y direction are two directions which are parallel to an upper surface of the silicon substrate 11 and orthogonal to each other, and a Z direction is a direction which is orthogonal to both the X direction and the Y direction, i.e., a laminating direction of each layer.

Each electrode layer 22 is made of, e.g., polysilicon. At a central part of the laminated body ML in the X direction, each electrode layer 22 is divided along the Y direction and forms control gate electrodes CG extending in the X direction. As seen from the upper side, i.e., the Z direction, the respective electrode layers 22 are patterned by using the same pattern. It is to be noted that, as will be described later, at both ends of the laminated body ML in the X direction, the electrode layers 22 are not divided along the Y direction and have one pair of comb-like shapes. On the other hand, each insulating layer 21 is made of, e.g., a silicon oxide ($SiO_2$) and functions as an interlayer insulating layer that insulates the electrode layers 22 from each other.

An insulating layer 23, a conductive layer 24, and an insulating layer 25 are formed on the laminated body ML in the mentioned order. The conductive layer 24 is made of, e.g., polysilicon, divided along the Y direction, and constitute selection gate electrodes SG extending in the X direction. Each pair of selection gate electrodes SG are provided in a region immediately above the uppermost control gate electrode CG. That is, the selection gate electrodes SG extend in the same direction as the control gate electrodes CG (the X direction), but their arrangement cycle is a half of that of the control gate electrodes CG. It is to be noted that, as will be described later, as the selection gate electrodes SG, there are a selection gate electrode SGb on the bit line side and a selection gate electrode SGs on the source line side.

An insulating layer 26 is provided on the insulating layer 25, and each source line SL extending in the X direction is provided on the insulating layer 26. Each source line SL is arranged in a region immediately above every other control gate electrode CG in the uppermost control gate electrodes CG arranged in the Y direction. Furthermore, an insulating layer 27 is provided on the insulating layer 26 to cover each source line SL, and bit lines BL extending in the Y direction are provided on the insulating layer 27. Each of the source lines SL and the bit lines BL is constituted of a metal layer.

Moreover, through holes 28 extending in a laminating direction (the Z direction) of each layer are formed to be pierced in the laminated body ML. Each through hole 28 is pierced in the control gate electrode CG on each stage, and a lower end of each through hole 28 reaches the back-gate BG. Additionally, the through holes 28 are arranged in the matrix shape along the X direction and the Y direction. Further, since each control gate electrode CG extends in the X direction, each through hole 28 arranged in the X direction is pierced in the same control gate electrode CG. Furthermore, an arrangement cycle of the through holes 28 in the Y direction is a half of an arrangement cycle of the control gate electrodes CG. As a result, two through holes 28 arranged in the Y direction form one pair, and the through holes 28 belonging to the same pair are pierced in the same control gate electrode CG.

Moreover, a connecting hole 29 is formed in an upper layer portion of the back-gate BG so that a lower end portion of the one through hole 28 can connect with a lower end portion of another through hole 28 that is apart from the former through hole 28 to interpose a gap corresponding to one column in the Y direction as seen from the former through hole 28. As a result, one pair of through holes 28 which are adjacent to each other in the Y direction and the connecting hole 29 which allows these through holes 28 to connect with each other form one continuous U-shaped hole 30. The U-shaped holes 30 are formed in the laminated body ML.

An oxide carbon oxide film (an OCO film: a film having a three-layer configuration including an oxide, a film including a thin film that mainly contains carbon, and an oxide film) 31 is provided on an inner surface of each U-shaped hole 30. In the OCO film 31, an insulative intermediate insulating layer 32, an intermediate layer 33, and a tunnel insulating layer 34 are sequentially laminated from the outer side. The intermediate insulating layer 32 is in contact with the back-gate BG, the control gate electrode CG, and the insulating layer 21. The intermediate insulating layer 32 and the tunnel insulating layer 34 are made of, e.g., a silicon oxide. The intermediate layer 33 has an insulating region 33a made of, e.g., a silicon oxide and a charge storage region 33b formed of a thin film mainly containing carbon. Specifically, the charge storage region 33b is placed to be adjacent to the control gate electrode CG in the Y direction and the X direction so that electric charges can be moved from each later-described silicon pillar 36 into the charge storage region 33b under control of the control gate electrode CG.

This charge storage region 33b functions as a floating gate FG if a resistance in the charge storage region 33b is low, and it functions as a charge trap type charge storage film if the resistance in the charge storage region 33b is high. That is, it is desirable for the charge storage region 33b to have low resistance or high resistance.

Further, the intermediate insulating layer 32 functions as an inter-electrode insulating layer when the charge storage region 33b functions as the floating gate FG, and it functions as a block insulating layer if the charge storage region 33b functions as a charge trap type charge storage layer.

Furthermore, for example, an impurity-doped semiconductor material (polysilicon) is buried in each U-shaped hole 30. As a result, a U-shaped silicon member 35 is provided in each U-shaped hole 30. Of the U-shaped silicon member 35, a portion placed in each through hole 28 is the silicon pillar 36, and a portion placed in the connecting hole 29 is a connection member 37. The silicon pillar 36 has a pillar-like shape extending in the Z direction, e.g., a cylindrical shape. Moreover, the connection member 37 has a pillar-like shape extending in the Y direction, e.g., a quadratic prism shape. The two silicon pillars 36 and the one connection member 37 constituting the U-shaped silicon member 35 are integrally formed, and hence the U-shaped silicon member 35 is continuously formed along the longitudinal direction in a seamless manner. Additionally, the U-shaped silicon member 35 is insulated from the back-gate BG and the control gate electrode CG by the OCO film 31. Here, although the silicon pillars 36 and the connection member 37 are described as the impurity-doped semiconductor material, they are not necessarily restricted to this material.

Further, through holes 38 are formed in the insulating layer 23, each selection gate electrode SG, and the insulating layer 25. Each through hole 38 is formed in a region immediately above each through hole 28 and connects with each through hole 28. Here, since each selection gate electrode SG extends in the X direction, each through hole 38 arranged in the X direction is pierced in the same selection gate electrode SG. Further, an arrangement cycle of the through holes 38 in the Y direction is the same as the arrangement cycle of the selection gate electrodes SG, and they have the same arrangement phase. Therefore, the through holes 38 arranged in the Y direction are associated with the selection gate electrodes SG in the one-on-one relationship and pierced in the selection gate electrodes SG which are different from each other.

A gate insulating layer 40 is formed on an inner surface of each through hole 38. Furthermore, for example, polysilicon is buried in each through hole 38 and formed as a silicon pillar 39. The silicon pillar 39 has a pillar-like shape extending in the Z direction, e.g., a cylindrical shape. A lower end portion of the silicon pillar 39 is connected to the upper end portion of the silicon pillar 36 formed in a region immediately below the silicon pillar 39. Further, the silicon pillar 39 is insulated from the control gate electrodes SG by the gate insulating layer 40. Moreover, the U-shaped silicon member 35 and one pair of silicon pillars 39 connected to the upper end portion of the U-shaped silicon member 35 constitute a U-shaped pillar 41.

A positional relationship between the U-shaped pillars 41, the control gate electrodes CG, the selection gate electrodes SG, the source lines SL, and the bit lines BL will now be described.

Each U-shaped pillar 41 is constituted by connecting one pair of silicon pillars 39 and 36, which are adjacent to each other in the Y direction, by the connection member 37. On the other hand, each control gate electrode CG, each selection gate electrode SG, and each source line SL extend in the X direction, and each bit line BL extends in the Y direction. Further, the U-shaped pillars 41 and the control gate electrodes CG have the same arrangement cycle in the Y direction, but their phases differ by a half cycle from each other, and hence one pair of silicon pillars 36 belonging to each U-shaped pillar 41, namely, two silicon pillars 36 connected to each other through the connection member 37 pierce through the control gate electrodes CG different from each other. On the other hand, two silicon pillars 36 belonging to two U-shaped pillars 41, which are adjacent to each other in the Y direction, and being adjacent to each other pierce through the common control gate electrodes CG.

Furthermore, the silicon pillars 39 arranged in the Y direction pierce through the selection gates SG which are different from each other, and hence one pair of silicon pillars 39 belonging to each U-shaped pillar 41 also pierce through the selection gate electrodes SG which are different from each other. On the other hand, the U-shaped pillars arranged in the X direction pierce through one pair of common selection gates SG.

Moreover, of one pair of silicon pillars belonging to each U-shaped pillar 41, one silicon pillar 39 is connected to the source line SL through a source plug SP buried in the insulating layer 26, and the other silicon pillar 39 is connected to the bit line BL through a bit plug BG buried in the insulating layers 26 and 27. Therefore, the U-shaped pillar 41 is connected between the bit line BL and the source line SL. In FIG. 3 to FIG. 6, of the selection gate electrodes SG through which each U-shaped pillar 41 pierces, the selection gate electrode SG arranged on the bit line side will be written as a selection gate electrode SGb, and the selection gate electrode SG arranged on the source line side will be written as a selection gate electrode SGs. Further, the U-shaped pillars 41 arranged in the X direction are connected to the common source line and also connected to the bit lines which are different from each other. Here, since the arrangement cycle of the U-shaped pillars 41 in the X direction is the same as the arrangement cycle of the bit lines BL, the U-shaped pillars 41 and the bit lines BL are associated with each other in the one-on-one relationship in the X direction. On the other hand, each pair of U-shaped pillars 41 arranged in the Y direction are connected to each source line SL and also connected to the common bit line BL.

As shown in FIG. 5, in the nonvolatile semiconductor memory device 100, the silicon pillar 36 functions as a channel, each control gate electrode CG functions as a gate electrode, and hence a vertical memory transistor 42 is formed at each intersecting portion of the silicon pillar 36 and the control gate electrode CG. Each memory transistor 42 functions as a memory cell transistor by storing electrons in the charge storage region 33b arranged between the silicon pillar 36 and the control gate electrode CG. The respective charge storage regions 33b provided in accordance with the control gate electrode CGs are electrically separated from each other by the insulating regions 33a in the Z direction. Therefore, even if each electric charge region 33b is formed of a film mainly containing carbon, electric charges do not move to the charge storage region 33b of any other memory cell transistor 42.

Moreover, as shown in FIG. 3 to FIG. 5, in the laminated body ML, since the silicon pillars 36 are arranged in the matrix shape along the X direction and the Y direction, the memory transistors 42 are three-dimensionally arranged in the X direction, the Y direction, and the Z direction.

Additionally, at each intersecting portion of the silicon pillar 39 and the selection gate electrode SG, a selection transistor 43 that uses the silicon pillar 39 as a channel, the selection gate electrode SG as a gate electrode, and the gate insulating layer 40 as a gate insulating layer is formed. This selection transistor 43 is a vertical transistor like the memory transistor 42.

Further, since the OCO film 31 is interposed between the connection member 37 and the back-gate BG, a back-gate transistor 4 that uses the connection member 37 as a channel, the back-gate BG as a gate electrode, and the OCO film 31 as a gate insulating layer is formed. That is, the back-gate BG functions as an electrode that controls a conductive state of the connection member 37 by an electric field.

As a result, as shown in FIG. 3, a memory string 45 connected between the bit line BL and the source line SL is formed along each U-shaped pillar 41. In the memory string 45, the selection transistors 43 are provided at both end portions, the back-gate transistor 44 is provided at a central portion, and the memory transistors 42 which are equal to the laminated electrode layers 22 in number are connected in series between each selection transistor 43 and the back-gate transistor 44. That is, the memory transistors 42 three-dimensionally arranged in the laminated body ML are treated as the memory string 45 in accordance with each U-shaped silicon member 35.

Furthermore, as shown in FIG. 6 and FIG. 7, the memory cell transistor region 12 of the nonvolatile semiconductor memory device 100 is divided into blocks 50. A positional relationship between each block 50 and each conducive member will now be described hereinafter.

As shown in FIG. 6 and FIG. 7, the blocks 50 set in the memory cell transistor 12 are aligned in the Y direction. Further, of the conductive members provided in the nonvolatile semiconductor memory device, the conductive members extending in the X direction, i.e., the control gates CG, the selection gate electrodes SG, and the U-shaped pillars 41 extending in the Z direction are grouped in accordance with each block 50. Furthermore, the back-gates BG formed along the XY plane are divided in accordance with each block 50 and electrically separated from each other. On the other hand, the bit lines BL extending in the Y direction extend to pass through all the blocks 50, and they are shared by all the blocks 50. An element isolation layer 59 is formed in each region between the blocks 50 on the silicon substrate 11.

Moreover, the control gate electrodes CG belonging to each block 50 are further divided into two groups. That is, the control gate electrodes CG are divided into control gate electrodes CG which are arranged in a region immediately below the source lines SL and through which each silicon pillar having an upper end portion connected with the source line SL pierces (represented as "control gate electrodes CGs" in FIG. 6 and FIG. 7) and control gate electrodes CG which are arranged in a region immediate below the source lines SL and through which each silicon pillar having an upper end portion connected with the bit line BL pierces (represented as "control gate electrodes CGb" in FIG. 6 and FIG. 7). Additionally, the control gate electrodes CGb and the control gate electrodes CGb are alternately arranged along the Y direction, the control gate electrodes CGs are connected in common, and the control gate electrodes CGs are also connected in common. Further, the control gate electrodes CGs and the control gate electrodes CGb are electrically separated from each other.

Specifically, as shown in FIG. 6 and FIG. 7, the electrode layers 22 (see FIG. 3) are not divided along the Y direction at both end portions of the laminated body ML parallel to the X direction, and notches extending in the Y direction are intermittently formed. As a result, in each block 50, the electrode layers 22 are divided into each pair of comb-shaped patterns meshing with each other, and they are the control gate electrodes CGs and the control gate electrodes CGb. It is to be noted that, in FIG. 5, the control gate electrode CGs has three comb teeth and the control gate CGb has two comb teeth to simplify the drawing, but the present embodiment is not restricted thereto, and these control gates may have more comb teeth.

Furthermore, each silicon pillar 36 arranged at an end portion of each block 50 in the Y direction has a lower end portion that is not connected to the connection member 37. Therefore, this silicon pillar 36 does not constitute the memory string 45, and it serves as a dummy silicon pillar 36 (which will be also referred to as a "dummy pillar" hereinafter) that does not contribute to storage of data. The back-gate BG is not provided in a region immediately below the dummy pillar 36d, and the element isolation layers 59 are formed on the silicon substrate 11.

<1.2 Operation>

Operations of the thus configured nonvolatile semiconductor memory device 100 according to this embodiment will now be described. FIG. 9 is a view showing potentials applied to each electrode and each wiring line in the operations of the nonvolatile semiconductor memory device 100 according to this embodiment.

In the following description, the memory transistor 42 is assumed to be an n-channel type field-effect transistor. Moreover, in the memory transistor 42, a state that electrons are stored in the charge storage region 33b and a threshold value is shifted to a positive value is determined as a value "0", and a state that electrons are not stored in the charge storage region 33b and the threshold value is not shifted is determined as a value "1". Additionally, the number of the control gate electrode layers is determined as four, and the memory transistor 42 which is a data write or read target (which will be referred to as a "selected cell" hereinafter) is determined as a memory transistor which is the third one from the bottom in the silicon pillar having the upper end portion connected to the bit line BL. That is, the control gate electrode CGb which is in the third layer from the bottom is a gate electrode of the selected cells.

<1.2.1 Write Operation>

Data is simultaneously written into selected cells arranged in the X direction in accordance with each block. As shown in FIG. 3, although these selected cells belong to the memory strings 45 which are different from each other, they share the same control gate electrodes CG. Further, although the memory strings 45 to which these selected cells belong are connected to the bit lines BL which are different from each other, they pierce through the common selection gate electrode SG and are connected to the common source line SL.

First, a Y coordinate of the memory string 45 to which the memory transistor 42 (the selected cell) as a write target belongs (which will be referred to as a "selected string" hereinafter) is selected. Specifically, as shown in FIG. 6, a selection gate potential Vsg is applied to the selection gate electrode SGb of the selected string, and an OFF potential Voff is applied to the selection gate electrode SGs. Furthermore, the OFF potential Voff is applied to the selection gate electrodes SGb and SGs of each non-selected memory string 45. The OFF potential Voff is a potential that turns off the transistor constituted by the gate electrode, and it is, e.g., a reference potential Vss. The reference potential Vss is, e.g., a ground potential (0 V). The selection gate potential Vsg is a potential that enables a conductive state of the selected transistor 43 constituted by the selection gate electrode SG to be determined by a potential in the silicon pillar (a body potential), and it is, e.g., a potential higher than the reference potential Vss. Additionally, a potential in the back-gate BG is determined as an ON potential Von. The ON potential Von is a potential that enables the transistor constituted by the gate electrode to be turned on, and it is, e.g., a power supply potential Vss (e.g., 3.0 V).

As a result, an ON state and an OFF state of the selected transistor 43 on the bit line side in the selected string are switched depending on a potential in the bit line BL, and the selected transistor 43 on the source line side is set to the OFF state. Further, the selected transistors 43 of each non-selected memory string 45 are set to the OFF state. Further, the back-gate transistors 44 of all the memory strings 45 are set to the ON state.

Then, the reference potential Vss (e.g., 0 V) is applied to the bit line BL connected to the selected cell into which the value "0" is written, and the power supply potential Vdd (e.g., 3.0 V) is applied to the bit line BL connected to the selected cell into which the value "1" is written. On the other hand, the power supply potential Vdd is applied to all the source lines SL.

In this state, a position of the selected cell in the selected string is selected. Specifically, potentials in the control gate electrodes CG constituting the selected cell, e.g., the control gate electrodes CGb which are in the third layer from the bottom are increased to a write potential Vpgm (e.g., 18 V), and potentials in other control gate electrodes CG, i.e., the control gate electrodes CGb excluding the counterparts in the third layer and all the control gate electrodes CGs are set to an intermediate potential Vpass (e.g., 10 V). At this time, since the control gate electrodes CGb in the third layer are connected to each other, the write potential Vpgm is applied to the control gate electrodes CGb even in non-selected memory strings. The write potential Vpgm is a sufficiently high potential that enables electrons to be implanted into the charge storage region 33b from the silicon pillar 36, and it is a potential higher than the reference potential Vss and the selection gate potential Vsg. That is, Vss<Vsg<Vpgm is achieved. Further, the intermediate potential Vpass is a potential higher than the reference potential Vss but lower than the write potential Vpgm. That is, Vss<Vpass<Vpgm is achieved.

As a result, in regard to the selected cell into which a value "0" is to be written, since a potential in the bit line BL is the reference potential Vss (e.g., 0 V) and a potential in the selection gate electrode SGb on the bit line side is the selection gate potential Vsg higher than the reference potential Vss, a potential difference between a source potential and a gate potential of the selection transistor 43 on the bit line side exceeds a threshold value, and this selection transistor 43 is turned on. As a result, a body potential Vbody of the selected cell is close to the reference potential Vss. Furthermore, a potential in the control gate electrode CG of the selected cell is the write potential Vpgm (e.g., 18 V). Therefore, a difference between a gate potential and a body potential (Vpgm−Vbody) in the selected cell is sufficiently large, and high-temperature electrons are generated due to this potential difference and implanted into the electron storage region 33b from the silicon pillar 36 through the tunnel insulating layer 34. As a result, the value "0" is written into this selected cell.

In regard to the selected cell into which a value "1" is to be written, since a potential in the bit line BL is a positive potential Vdd (e.g., 3.0 V) and a potential in the selection gate electrode SGb on the bit line side is the selection gate potential Vsg higher than the reference potential Vss, a potential difference between a source potential and a gate potential of the selection transistor 43 on the bit line side is small, and this selection transistor 43 is turned off by a back-gate effect. As a result, the silicon pillar 36 enters a floating state, and the body potential Vbody of the selected cell is maintained at a high value by coupling with the control gate electrode CG to which the intermediate potential Vpass (e.g., 10 V) has been applied. Therefore, a difference between the write potential Vpgm (e.g., 18 V) and the body potential Vbody (Vpgm−Vbody) of the control gate electrode CG3 in the selected cell is small, and electrons are not implanted into the charge storage region 33b. As a result, the value "1" is written into this selected cell.

Moreover, in each non-selected memory string 45, since the selection transistors 43 at both end portions are OFF, a potential in the silicon pillar 36 enters the floating state. In this case, the body potential Vbody of the silicon pillar 36 can be controlled by a potential that is applied to each control gate electrode CG, its boosting rate, and a potential in the selection gate electrode, and this potential can be maintained at a high potential. As a result, a difference between the gate potential and the body potential (Vpgm−Vbody) in the memory transistor 42 becomes small, electrons are not implanted into the charge storage region 33b, and an original value is maintained.

As described above, in this embodiment, conductive state of the selection transistor is controlled, a row into which data is to be written (a Y coordinate) is selected, and the data is written in the order of rows of the memory strings 45 arranged in the X direction. At this time, potentials in the control gate electrodes are controlled in blocks. Therefore, as disturb at the time of writing, considering a total amount of time required for writing data into the memory strings in the blocks can suffice. As a result, adjusting a block size enables control of a disturb time.

<1.2.2 Read Operation>

As shown in FIG. 6, the ON potential Von is applied to the back-gate BG, and the back-gate transistor 44 is turned on. Additionally, the ON potential Von (e.g., 3.0 V) is applied to the selection gate electrodes SGs and SGb of the selected string, and the selection transistor 43 is turned on. On the other hand, the OFF potential Voff (e.g., 0 V) is applied to the selection gate electrodes SGs and SGb of each non-selected memory string 45, and the selection transistor 43 is turned off.

Further, a potential that allows a conductive state to vary depending on a value of the selected cell is applied to the control gate electrode CG of the selected cell, i.e., the control gate electrode CGb in the third layer from the bottom. This potential is such a potential that a current does not flow through the body when a value of the selected cell is "0", i.e., when electrons are stored in the charge storage region 33b and a threshold value is shifted to a positive value or that a current flows through the body if a value of the selected cell is "1", i.e., when electrons are not stored in the charge storage region 33b and the threshold value is not shifted, and it is, e.g., the reference value Vss (e.g., 0 V). Furthermore, such a read potential Vread (e.g., 4.5 V) by which the memory transistors 42 other than the selected cell are turned on irrespective of its value is applied to the control gate electrodes constituting these memory transistors 42.

In this state, a potential Vbl (e.g., 0.7 V) is applied to each bit line BL, and the reference value Vss (e.g., 0 V) is applied to each source line SL. As a result, a current flows through the selected string if a value of the selected cell is "1", and a current does not flow through the selected string if the value of the selected cell is "0". Therefore, when a current flowing in the source line SL from the bit line BL through the selected string is detected or when a drop in potential of the bit line BL is detected, a value of the selected cell can be read out. It is to be noted that, in regard to each non-selected memory string 45, the selection transistor 43 is OFF, and hence a current does not flow irrespective of a value stored in each memory transistor 42.

<1.2.3 Erase Operation>

Data is erased in blocks.

As shown in FIG. 6, the ON potential Von is applied to the back-gate BG, and the back-gate transistor 44 is turned on.

Moreover, the reference potential Vss (e.g., 0 V) is applied to all the control gate electrodes CG in a block as an erase target (which will be also referred to as a "selected block"). Additionally, potentials in the bit line BL and the source line SL are increased to an erase potential Verase (e.g., 15 V). Further, the selection gate potential Vsg lower than the erase potential Verase is applied to the selection gate electrodes SGb and SGs. That is, Vsg<Verase is achieved.

As a result, since the potentials in the bit line BL and the source line SL become the erase potential Verase (e.g., 15 V), and the potentials in the selection gate electrodes SGb and SGs become the selection gate potential Vsg, a hole current is generated by interband tunneling caused due to a potential difference between the bit line BL and the selection gate electrode SGb and a potential difference between the source line SL and the selection gate electrode SGs, and a potential in the silicon pillar 36, i.e., the body potential is increased. On the other hand, since the reference potential Vss (e.g., 0 V) is applied to each control gate electrode CG in the block as the erase target (the selected block), holes are implanted into the charge storage region 33b of the memory transistor 42 due to a potential difference between the silicon pillar 36 and the control gate electrode CG, and electrons in the charge storage region 33b are annihilated. Consequently, the data is erased. It is to be noted that, since the body potential is increased due to implantation of the hole current, a sufficient potential difference between the erase potential Verase and the selection gate potential Vsg must be taken in order to implant sufficient holes into the charge storage region 33b.

On the other hand, in each block which is not the erase target (a non-selected block), potentials in the selection gate electrodes SGb and SGs are increased to potentials close to those of the bit line BL and the source line SL, and an electric field between a diffusion layer connected to the bit line BL or the source line SL and the selection gate electrode SGb or SGs is weakened so that the hole current cannot be generated. Alternatively, the potential in each control gate electrode CG is increased simultaneously with that in the silicon pillar 36 to prevent the holes in the silicon pillar 36 from being implanted into the charge storage region 33b. As a result, in each non-selected block, a value which has been already written in the memory transistor 42 is maintained as it is.

<1.3 Manufacturing Method>

A description will now be given as to an example of a manufacturing method of the nonvolatile semiconductor memory device 100 according to this embodiment with reference to FIG. 4 and FIG. 10 to FIG. 23.

FIG. 10 is a flowchart schematically showing a manufacturing method of the nonvolatile semiconductor memory device 100 according to this embodiment. Each of FIG. 11A to FIG. 25A is a cross-sectional view taken along a Z-Y plane illustrating a basic manufacturing method of the nonvolatile semiconductor memory device according to this embodiment. Further, each of FIG. 11B to FIG. 25B is a plan view taken along an X-Y plane illustrating the basic manufacturing method of the nonvolatile semiconductor memory device according to this embodiment.

[Step S1001]

Figure 11A:
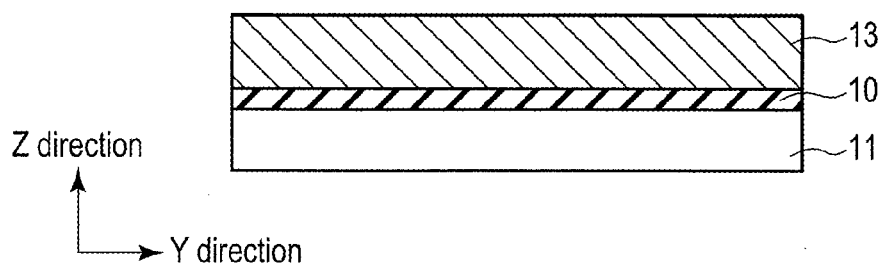
FIG. 11A is a cross-sectional view taken along a Z-Y plane which illustrates a basic manufacturing method of the nonvolatile semiconductor memory device according to the first embodiment.
Figure 11B:
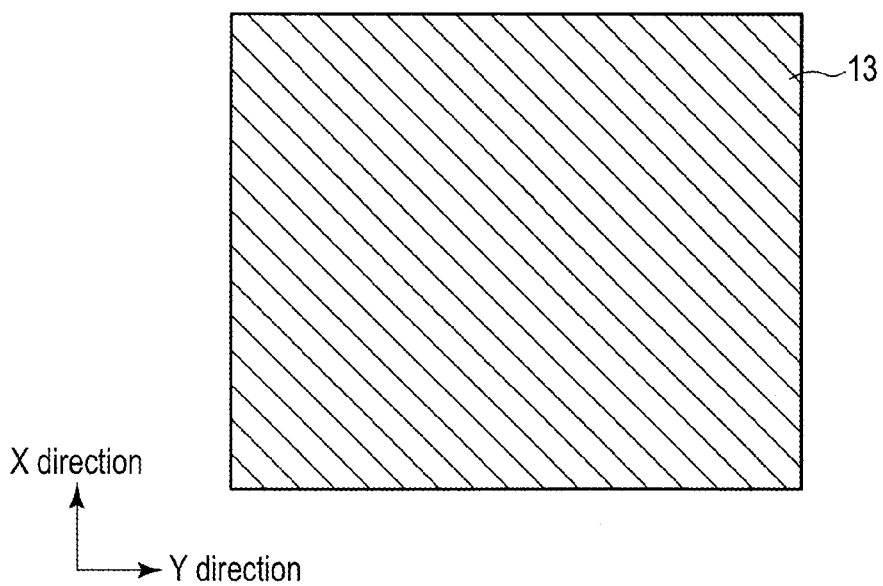
FIG. 11B is a plan view taken along an X-Y plane which illustrates the basic manufacturing method of the nonvolatile semiconductor memory device according to the first embodiment.

First, as shown in FIGS. 11A and B, the silicon substrate 11 is prepared. On this silicon substrate 11, the memory cell transistor region 12 is set, and a peripheral circuit region (not shown) is set around the memory cell transistor region 12. Further, the element isolation layer is formed in a predetermined region of an upper layer portion of the silicon substrate 11. At this time, the element isolation region 59 (see FIG. 4) is also formed in a region where the dummy pillar 36d (see FIG. 4) is to be formed at a later step. Then, in the peripheral circuit region, a thick-film gate insulating layer for a high-breakdown voltage transistor and a thin-film gate insulating layer for a low-breakdown voltage transistor are separately formed. At this time, the insulating layer 10 is also formed on the silicon substrate 11 in the memory cell transistor region 12. Subsequently, the polysilicon film 13 having a film thickness of approximately 200 nm is deposited as a conductive layer on the insulating layer 10.

Figure 12A:
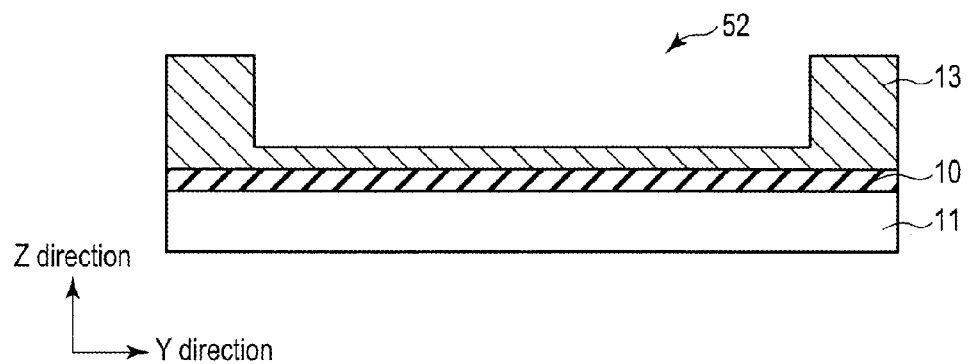
FIG. 12A is a cross-sectional view taken along the Z-Y plane which illustrates the basic manufacturing method of the nonvolatile semiconductor memory device according to the first embodiment.
Figure 12B:
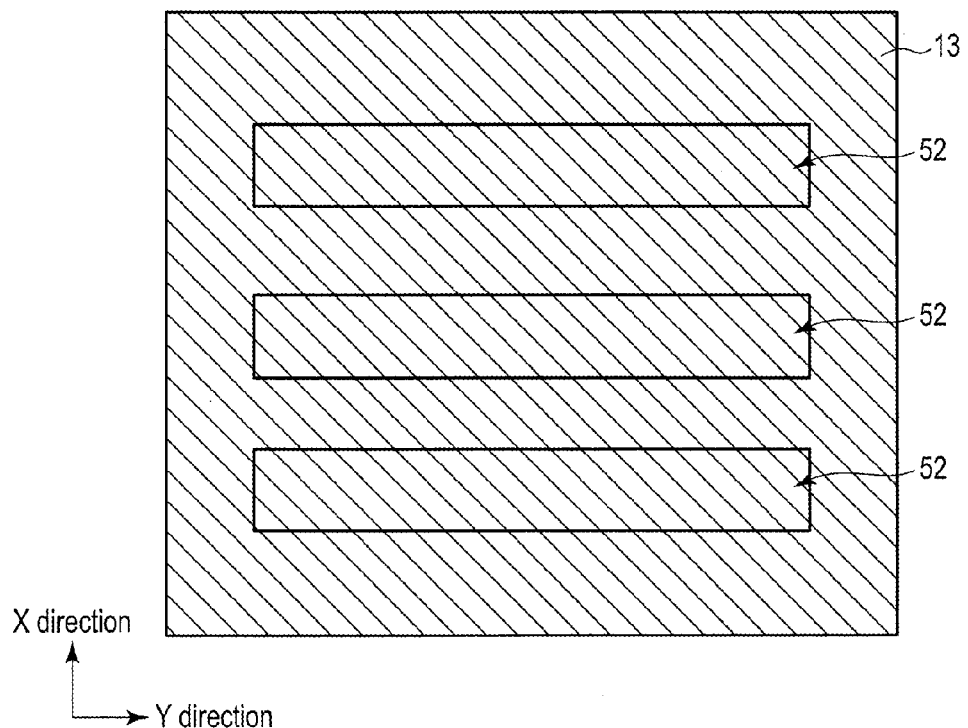
FIG. 12B is a plan view taken along the X-Y plane which illustrates the basic manufacturing method of the nonvolatile semiconductor memory device according to the first embodiment.

Then, as shown in FIGS. 12A and B, in the memory cell transistor region 12, an upper layer portion of the polysilicon film 13 is subjected to photolithography and reactive ion etching (RIE), and strip-like grooves 52 extending in the Y direction are formed on an upper surface of the polysilicon film 13. The grooves 52 are arranged in a matrix shape along the X direction and the Y direction. Each groove 52 is a concave portion formed on the upper surface of the polysilicon film 13.

Subsequently, as shown in FIGS. 13A and B, a non-doped amorphous silicon layer 56 containing no boron (an impurity) is deposited by, e.g., low-pressure chemical vapor deposition (LPCVD), whereby each sacrificial film 53 is formed on the polysilicon film 13. At this time, the sacrificial film 53 is also buried in each groove 52. Then, each sacrificial film 53 and the polysilicon film 13 are treated by, e.g., the photolithography and the RIE. As a result, in the memory cell transistor region 12, the polysilicon film 13 is divided in accordance with each block 50 (see FIG. 7), the tabular back-gate BG constituted of the polysilicon film 13 is formed in each block 50, and a gate electrode constituted of the polysilicon film 13 is formed in the peripheral circuit region.

Thereafter, in the peripheral circuit region, a spacer made of a silicon oxide is formed, ion implantation is carried out, and a diffusion layer is formed. Subsequently, in the peripheral circuit region, an interlayer insulating layer is deposited, flattening is performed, and recessing is effected in such a manner that the upper surface can be level with the upper surface of the polysilicon film 13. Then, each sacrificial film 53 is recessed and removed from the upper side of the polysilicon film 13 so that each sacrificial film 53 can remain in each groove 52.

[Step S1002]

Figure 14A:
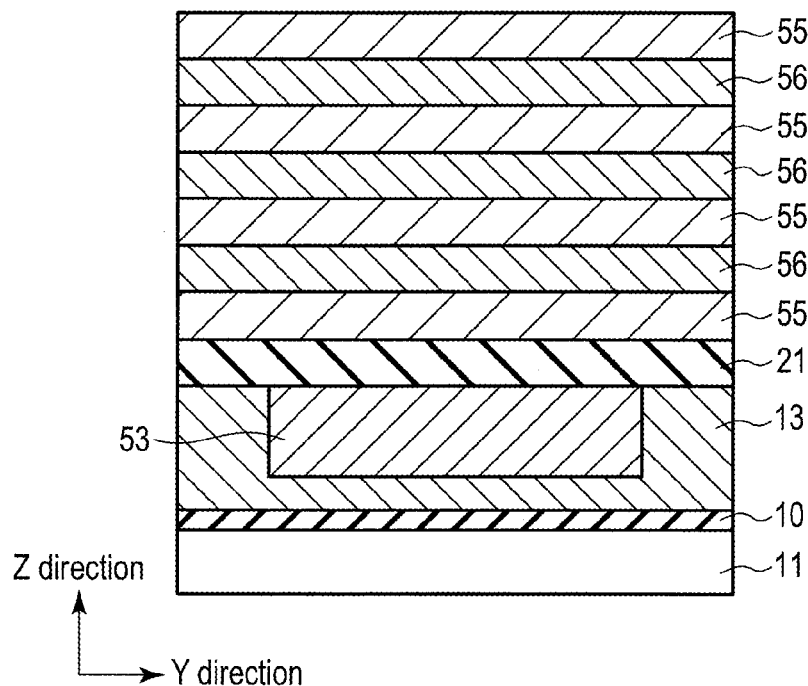
FIG. 14A is a cross-sectional view taken along the Z-Y plane which illustrates the basic manufacturing method of the nonvolatile semiconductor memory device according to the first embodiment.
Figure 14B:
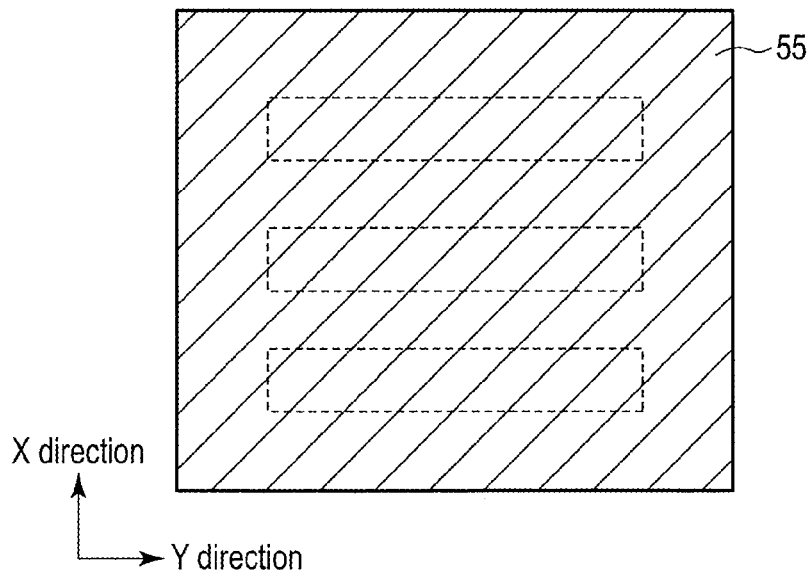
FIG. 14B is a plan view taken along the X-Y plane which illustrates the basic manufacturing method of the nonvolatile semiconductor memory device according to the first embodiment.

Then, as shown in FIGS. 14A and B, for example, a silicon oxide film that functions as a protective film 21 is formed on the polysilicon film 13 and each sacrificial film 53 by, e.g., chemical vapor deposition (CVD). Subsequently, at least two or more layers each including an amorphous silicon layer 55 containing boron (an impurity) that serves as a control gate electrode with a thickness of approximately 30 nm to 50 nm and a non-doped amorphous silicon layer 56 which has a thickness of approximately 30 nm to 50 nm and does not contain boron (an impurity) are deposited on the protective film 21 by the low-pressure chemical vapor deposition (LPCVD) alternately using a silane ($SiH_4$) gas and a mixed gas of silane and boron trichloride ($BCl_3$), thereby forming the laminated body ML. It is to be noted that the boron concentration of the amorphous silicon layer 55 is approximately $5 \times 10^{20}$ atom/cm$^3$ to $2 \times 10^{21}$ atom/cm$^3$. Furthermore, in the process of forming the amorphous silicon layer 56 and the amorphous silicon layer 55, controlling ON/OFF of the boron trichloride gas enables forming the amorphous silicon layer 56 and the amorphous silicon layer 55 in the same film forming device without changing the device. Subsequently, an amorphous carbon layer (not shown) serving as a hard mask is deposited.

[Step S1003]

Figure 15A:
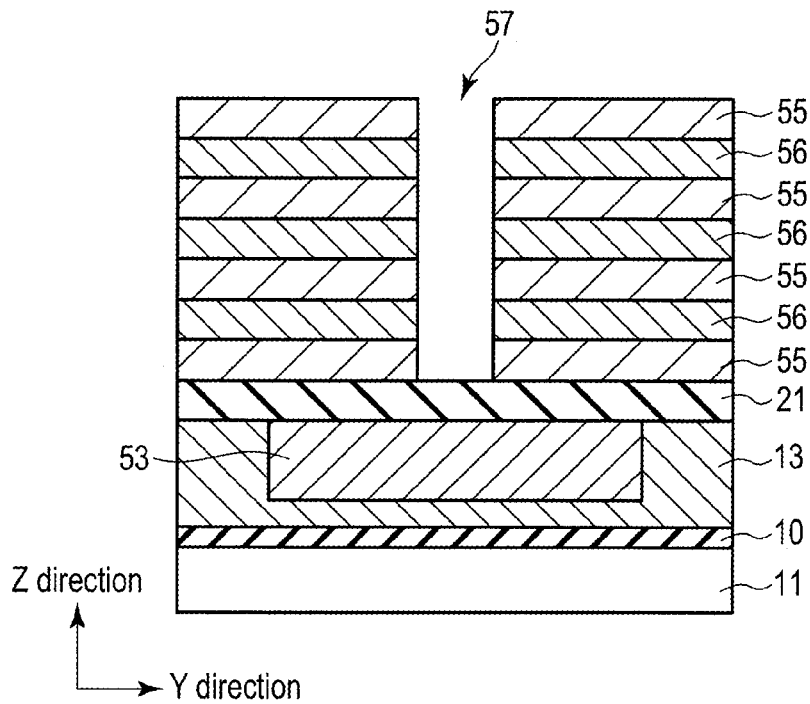
FIG. 15A is a cross-sectional view taken along the Z-Y plane which illustrates the basic manufacturing method of the nonvolatile semiconductor memory device according to the first embodiment.
Figure 15B:
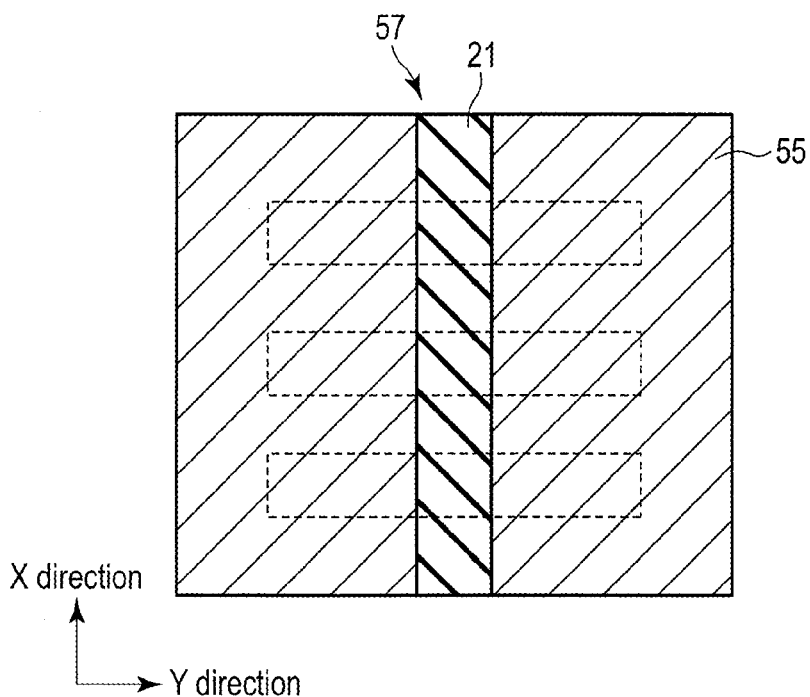
FIG. 15B is a plan view taken along the X-Y plane which illustrates the basic manufacturing method of the nonvolatile semiconductor memory device according to the first embodiment.

Then, as shown in FIGS. 15A and B, the amorphous carbon layer 110 is used as a mask, the laminated body ML is etched by anisotropic etching such as RIE, and a groove (a slit) 57 is formed in the laminated body ML. The groove 57 is formed in such a manner that it extends to connect regions between two silicon pillars 36 connected to the connection member 37 and reaches the protective film 21 in the lowermost layer.

At this time, as shown in FIG. 7 and FIG. 8, the groove 57 is formed to divide each electrode layer 22 into a pattern of a pair of meshing comb-like shapes. That is, the groove 57 is formed at the central portion of the laminated body ML in the X direction in such a manner that it extends in the X direction. As a result, each electrode layer 55 is divided into the control gate electrodes CG extending in the X direction. At this time, the groove 57 is not formed in a region immediately above a region between the connection members 37 in the Y direction. As a result, each control gate electrode CG is pierced by the two silicon pillars 36 arranged in the Y direction. Moreover, the groove 57 is formed in such a manner that it does not extend in the X direction but intermittently extends in the Y direction at both end portions of the laminated body ML in the X direction. As a result, the control gate electrodes CGb and CGs alternately arranged along the Y direction at the central portion of the laminated body ML in the X direction are connected to the respective end portions of the laminated body ML in the X direction.

[Step S1004]

Then, as shown in FIGS. 16A and B, when a silicon nitride film is embedded in the groove 57, the sacrificial film 58 is formed. This sacrificial film 58 supports the amorphous silicon layer 55 at a later-described step. Additionally, the through holes 28 extending in the Z direction are collectively formed in the laminated body ML by, e.g., the RIE. At this time, the through holes 28 are arranged in the matrix shape along the X direction and the Y direction. Furthermore, bottom portions of the through holes 28 are formed to reach both end portions of the sacrificial film 53 buried in the groove 52. As a result, the two through holes 28 adjacent to each other along the Y direction are formed to reach each sacrificial film 53.

[Step S1005]

Then, as shown in FIGS. 17A and B, the amorphous silicon layers 56 and the sacrificial film 53 alone are selectively etched by using a chemical solution that can selectively etch the amorphous silicon layers 55, the amorphous silicon layers 56, and the sacrificial film 53, e.g., an alkaline chemical solution. More specifically, a choline liquid is used, an alkaline selection ratio is utilized, and the amorphous silicon layers 56 and the sacrificial film 53 alone, which are non-doped regions, are selectively etched. As a result, the amorphous silicon layers 56 and the sacrificial film 53 are removed. At this time, since a sacrificial film 112 supports an amorphous silicon layer 106, the amorphous silicon layer 106 is held at a predetermined position. Further, when the sacrificial film 53 is removed, the connecting hole 29 is formed, and the connecting hole 29 and the two through holes 28 connecting with both end portions of the connecting hole 29 form one continuous U-shaped hole 30.

[Step S1006]

Subsequently, as shown in FIGS. 18A and B, the insulating layer 59 that serves as part of the intermediate insulating layer 32 and the interlayer insulating layer 21 is deposited on the entire surface. As a result, the insulating layer 59 is formed in the U-shaped hole 3. More specifically, the insulating layer 59 is formed on exposed surfaces of the amorphous silicon layer 55, the polysilicon layer 13, and the protective film 21.

Figure 19A:
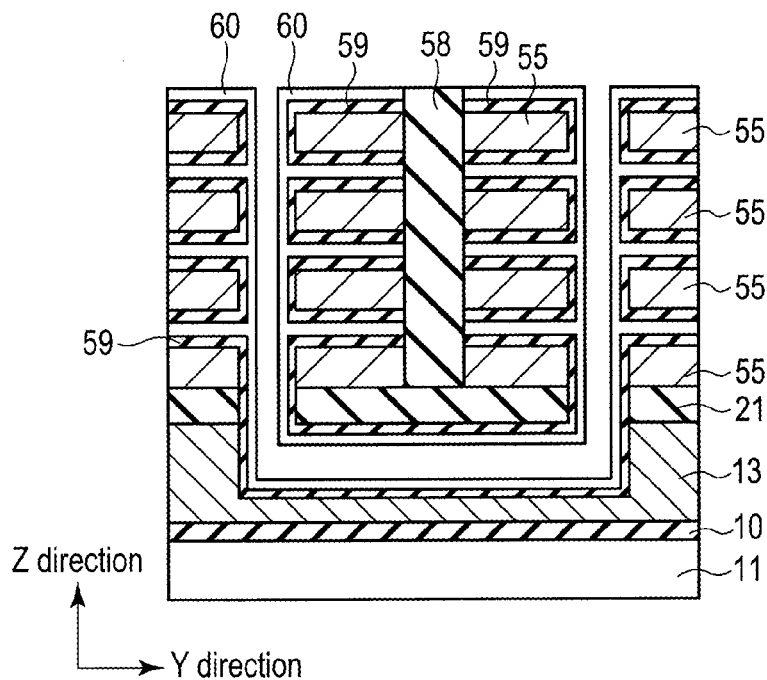
FIG. 19A is a cross-sectional view taken along the Z-Y plane which illustrates the basic manufacturing method of the nonvolatile semiconductor memory device according to the first embodiment.
Figure 19B:
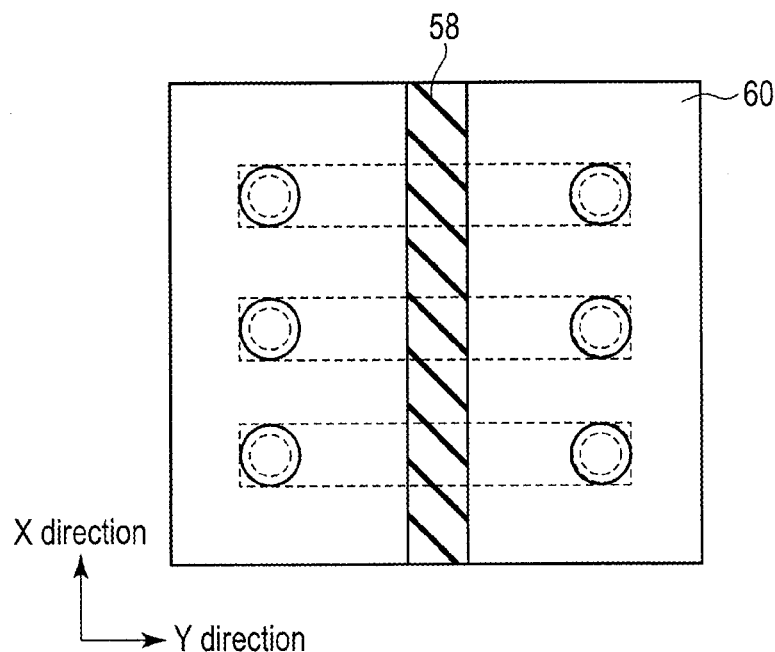
FIG. 19B is a plan view taken along the X-Y plane which illustrates the basic manufacturing method of the nonvolatile semiconductor memory device according to the first embodiment.

Subsequently, as shown in FIGS. 19A and B, as a charge storage film 60 that will turn into the charge storage region 33b later, a thin film (e.g., amorphous carbon) mainly containing carbon is deposited on the entire surface by the CVD method. As a result, the charge storage film 60 is formed on the insulating layers 59 and the sacrificial film 58 in the U-shaped hole 30. Consequently, the charge storage film 60 is embedded between the insulating layers 59 formed on the amorphous silicon layers 55 adjacent to each other in the Z direction.

Subsequently, as shown in FIGS. 20A and B, as the tunnel insulating layer 34, a silicon oxide film is deposited on the entire surface. As a result, the tunnel insulating layer 34 is formed on the charge storage film 60 in the U-shaped hole 30.

Figure 21A:
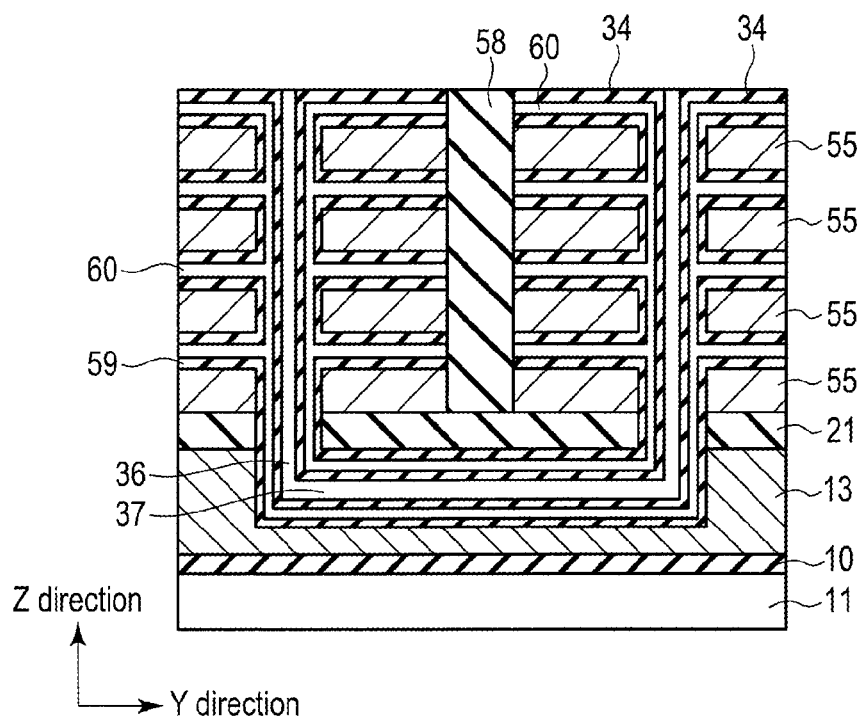
FIG. 21A is a cross-sectional view taken along the Z-Y plane which illustrates the basic manufacturing method of the nonvolatile semiconductor memory device according to the first embodiment.
Figure 21B:
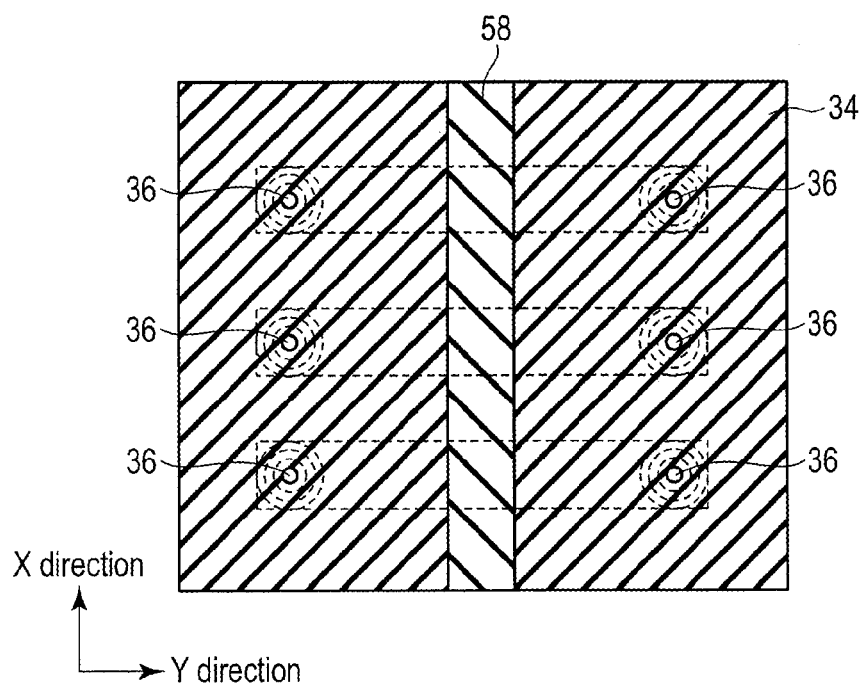
FIG. 21B is a plan view taken along the X-Y plane which illustrates the basic manufacturing method of the nonvolatile semiconductor memory device according to the first embodiment.

Subsequently, as shown in FIGS. 21A and B, amorphous silicon is deposited on the entire surface. As a result, the amorphous silicon is embedded above the tunnel insulating layer 34 in the U-shaped hole 30, and the U-shaped silicon member 35 is formed. The U-shaped silicon member 35 is constituted of one pair of silicon pillars 36 buried in the through holes 28 and one connection member 37 buried in the connecting hole 29.

[Step S1007]

Then, as shown in FIGS. 22A and B, the sacrificial film 58 is removed in such a manner that part of the charge storage film 60 formed between at least the amorphous silicon layers 55 is exposed by the RIE or the like. At this time, the protective film 21 may be etched. The laminated body ML is processed by, e.g., the RIE, and a groove 57-2 is formed in the laminated body ML. The groove 57-2 extends in the X direction to connect regions between the two silicon pillars 36 connected to the connection member 37, and it is formed to reach the lowermost insulating layer 21. At the time of this RIE, part of the charge storage film 60 sandwiched between the insulating layers 59 is exposed to an etching gas of the RIE. When an etching gas containing oxygen is used as the etching gas, the charge storage film 60 exposed to the etching gas is converted into $CO_2$. As a result, when a time for exposing the charge storage film 60 to the etching gas is adjusted, the charge storage film 60 can remain at a desired position alone. In this embodiment, the charge storage film 60 sandwiched between the insulating layers 59 and the charge storage film 60 which is continuous in the Z direction is removed in such a manner that the charge storage film 60 remains on the amorphous silicon layer 55 at portions close to each other in the X-Y plane direction. The remaining charge storage film 60 without being removed turns into the charge storage region 33b, and each portion from which the charge storage film 60 is removed turns into an air gap 61.

[Step S1008]

Then, as shown in FIGS. 23A and B, the insulating layer 23 is deposited and flattened on the laminated body ML by using an atomic layer deposition (ALD) method or the like. As a result, as an insulating layer 62 that functions as part of the interlayer insulating layer and the inter-electrode insulating layer, a silicon oxide film is formed in the air gap 61 and the groove 57-2. Therefore, the isolated electric charge storage region 33b is formed at each gate. Specifically, the insulating layers 59 and the insulating layer 62 sandwiched between the amorphous silicon layers 55 in the Z direction serve as the interlayer insulating layer 21. Further, the insulating layer 62 buried between the charge storage regions 33b in the Z direction functions as the insulating region 33a, whereby the intermediate layer 33 having the insulating region 33a and the charge storage region 33b is formed. Furthermore, the insulating layer 59 sandwiched between the charge storage region 33b and the amorphous silicon layer 55 in a direction parallel to the X-Y plane and the insulating layer 62 sandwiched between the respective insulating layers 59 in the Z direction are determined as the intermediate insulating layer 32. Thereafter, a heat treatment is performed at a temperature of, e.g., approximately 600° C., each amorphous silicon layer 55 is crystallized, and each polysilicon layer 22 that functions as the control gate electrode CG can be thereby formed.

As a result, each cylindrical semiconductor region 36 vertical to the silicon substrate 11 is formed above the substrate (the silicon substrate) 11 including the semiconductor substrate. Additionally, the tunnel insulating layer 34 is formed on the side surface of each semiconductor region 36, namely, the periphery of the same. The intermediate layer 33 including the charge storage region (the charge storage film) 33b is formed on the side surface of the tunnel insulating layer 34, and the intermediate insulating layer 32 is formed on the side surface of the charge storage region 33b. The tabular control gate electrodes 22 which contain boron (B) and are parallel to the silicon substrate 11 are formed on the side surface of the intermediate insulating layer 32 in close contact with each other, and the interlayer insulating layers 22 are formed on the surfaces of the intermediate insulating layer 32 and the control gate electrodes 22. Here, since the thin film that mainly contacts carbon is used as the charge storage region 33b, the charge storage region 33b functions as, e.g., a floating gate electrode.

[Step S1009]

Figure 24A:
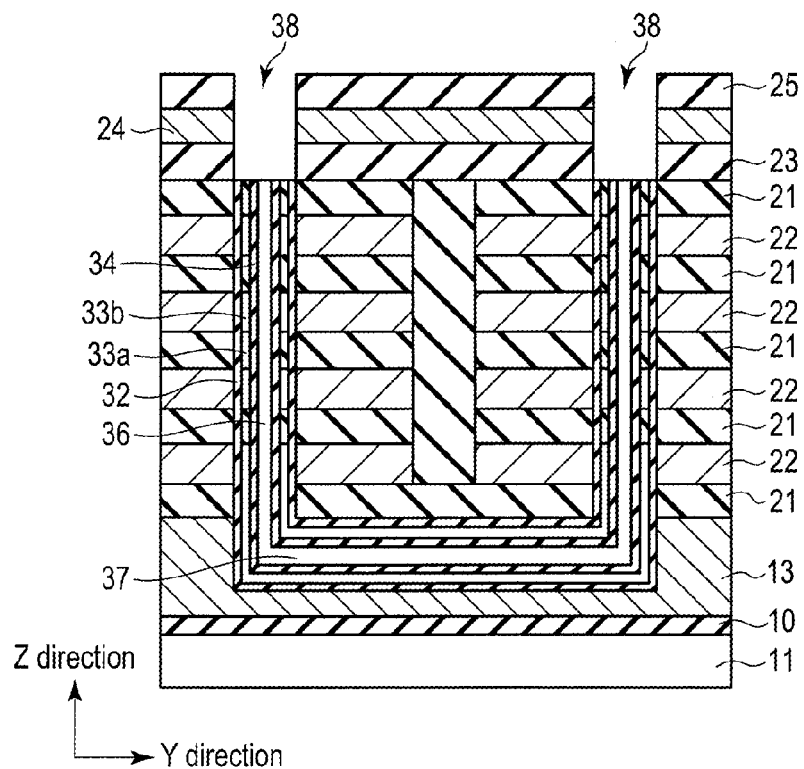
FIG. 24A is a cross-sectional view taken along the Z-Y plane which illustrates the basic manufacturing method of the nonvolatile semiconductor memory device according to the first embodiment.
Figure 24B:
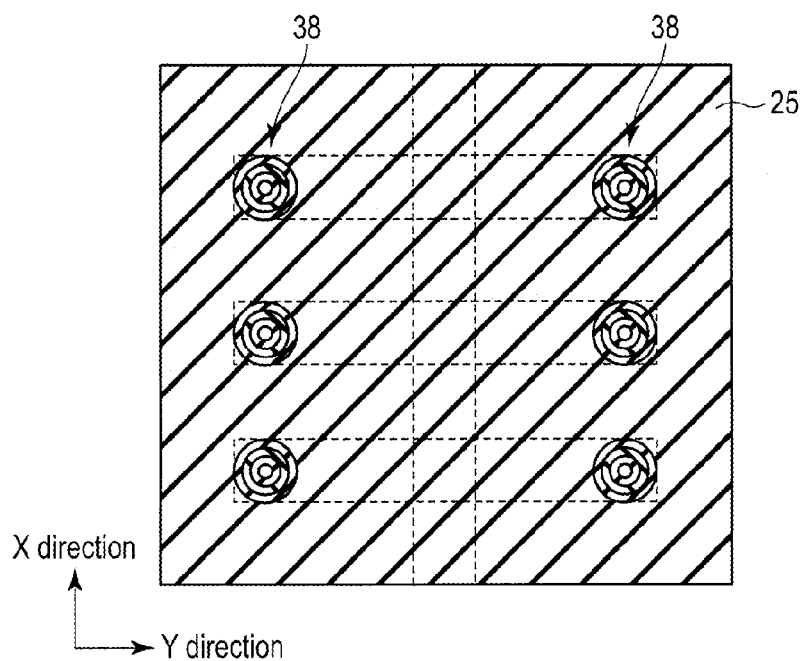
FIG. 24B is a plan view taken along the X-Y plane which illustrates the basic manufacturing method of the nonvolatile semiconductor memory device according to the first embodiment.

Then, as shown in FIGS. 24A and B, for example, the conductive layer 24 is formed on the insulating layer 23, and a resist film (not shown) is formed on the conductive layer 24. Further, the laminated body ML is processed into a step-like pattern by repeating etching using this resist film as a mask and slimming of the resist film. As a result, both the end portions of the control gate electrode CG on each stage in the X direction are not covered with the control gate electrode CG immediately above its counterpart as seen from above, and a contact can be formed with respect to the control gate electrode CG on each stage from above at a subsequent step. Then, an etching stopper film (not shown) made of, e.g., a silicon nitride is formed to cover the laminated body ML processed into the step-like pattern, and an interlayer insulating layer (not shown) is formed thereon, and an upper surface of this layer is flattened. As a result, the periphery of the laminated body ML is buried by the interlayer insulating layer.

Further, as shown in FIG. 25, the insulating layer 25 is formed on the conductive layer 24. Furthermore, each through hole 38 is formed in such a manner that the through hole 38 is pierced in the insulating layer 25, the conductive layer 24, and the insulating layer 23 and reaches the upper end of the through hole 28 in the laminated body ML.

Then, an insulating layer is deposited on the entire surface, and amorphous silicon is deposited. Furthermore, the amorphous silicon and the insulating layer are etched back to remain in each through hole 38 alone. As a result, the gate insulating layer 40 is formed on the inner surface of each through hole 38, and the amorphous silicon is buried. Subsequently, a heat treatment is performed at a temperature of, e.g., 600° C., and the amorphous silicon in each through hole 38 is crystallized, thereby providing polysilicon. Moreover, arsenic (As) ions are implanted into this polysilicon with an accelerating voltage of 40 key and a dosage of $3 \times 10^{15}$ cm-2, and a drain diffusion layer (not shown) is thereby formed. As a result, the silicon pillar 39 is formed in each through hole 38. The silicon pillar 39 is connected to the silicon pillar 36. Additionally, at the time of the heat treatment, the amorphous silicon layer 55 may be crystallized.

Then, a treatment, e.g., the RIE is given to the insulating layer 25 and the conductive layer 24. The groove 52 extending in the X direction is formed in a region between the silicon pillars 39 which are adjacent to each other in the Y direction. As a result, the conductive layer 24 is divided along the Y direction, and the selection gate electrodes SG extending in the X direction are formed.

Then, as shown in FIG. 4, the insulating layer 26 is formed on the insulating layer 23 and the insulating layer 25, the source plug SP is buried in the insulating layer 26, and the source line SL extending in the X direction is formed on the insulating layer 26. At this time, the source line SL is connected to the drain diffusion layers of some of the silicon pillars 39 through the source plug SP. Further, a contact (not shown) that is connected to each control gate electrode CG and each selection gate electrode SG from above is formed in the interlayer insulating layer (not shown) provided around the laminated body ML. Subsequently, the insulating layer 27 is formed on the insulating layer 26 to cover the source line SL. Then, the bit plug BP is buried in the insulating layers 27 and 19, and the bit line BL extending in the Y direction is formed on the insulating layer 27. At this time, the bit line BL is connected to the drain diffusion layers of the remaining silicon pillars 39 through the bit plug BP. This completes the manufacture of the nonvolatile semiconductor memory device 100.

<1.4 Functions and Effects According to First Embodiment>

According to the first embodiment, the nonvolatile semiconductor memory device 100 has the substrate 11 and the laminated body ML having the configuration where the first insulating layers 21 and the first electrode layers 22 are alternately laminated along the first direction (the Z direction) vertical to the substrate 11. Furthermore, the nonvolatile semiconductor memory device 100 includes, along the first direction, the second insulating layers 32 each of which is formed on the inner wall of the first through hole 28 pierced in the first insulating layers 21 and the first electrode layers 22, the intermediate layers 33 each of which is formed on the surface of the second insulating layer 32, the third insulating layers 34 each of which is formed on the surface of the intermediate layer 33, and the pillar-like first semiconductor regions 36 each of which is formed on the surface of the third insulating layer 34 and extends along the first direction. Moreover, the nonvolatile semiconductor memory device 100 includes the second electrode layers BG provided between the substrate 11 and the laminated body ML, the second through holes 29 each of which is formed in the second electrode layer BG and formed along at least the third direction orthogonal to the first direction, and the pillar-like second semiconductor regions 37 extending along the third direction. Additionally, each intermediate layer 33 includes the charge storage regions 33b mainly containing carbon at positions adjacent to the first electrode layers 22 in the second direction orthogonal to the first direction, and it also includes the insulating regions 33a that electrically separate the charge storage regions 33b adjacent along the first direction at positions adjacent to the first insulating layers 21 in the second direction. Further, each second insulating layer 32, each intermediate layer 33, and each third insulating layer 34 are formed on the inner wall of each second through hole 29, and each semiconductor region 37 is formed on the surface of the third insulating layer 34 formed on each second through hole 29.

As described above, the charge storage regions 33b that function as the charge storage layers of the memory cell transistor MT are electrically separated by the insulating regions 33a in the Z direction.

Meanwhile, there can be considered a configuration where the intermediate layer 33 is determined as a charge trap type charge storage insulating layer made of a nitride such as SiN or an oxide such as $HfO_2$ and the charge storage insulating layer is continuous in each memory cell transistor. In the case of such a configuration, there may possibly occur a problem that electric charges are stored in the charge storage insulating layer between the two control gate electrodes adjacent to each other in the Z direction or the electric charges stored in the charge storage insulating layer transfer in the film along the Z direction, for example.

However, as described above, the charge storage regions 33b are electrically separated by the insulating regions 33a along the Z direction. Therefore, even in an operation mode such as writing or erasing, it is possible to suppress, e.g., a problem that the electric charges are stored in each insulating region 33b between the charge storage regions 33b and the electric charges stored in each charge storage region 33b move to another charge storage region 33b. Therefore, erroneous writing or the like caused due to such a problem can be prevented from occurring. As a result, it is possible to obtain the nonvolatile semiconductor memory device having excellent data retention characteristics.

Second Embodiment

A second embodiment will now be described with reference to FIG. 26. Here, a description will be given as to preferred compositions of a thin film mainly containing carbon which is a charge storage region 33b (a charge storage film 60) in the same configuration as the first embodiment. FIG. 26 is a table showing a range of preferred compositions of the thin film mainly containing carbon which is the charge storage film 60. It is to be noted that a basic configuration and a basic operation are the same as those in the first embodiment. Therefore, a description on the matters explained in the first embodiment and the matters that can be easily analogized from the first embodiment will be omitted.

<2.0 Experiment Method>

Meanwhile, preferred compositions of a thin film mainly containing carbon which is the charge storage film 60 which will be described below are determined by forming samples for analysis. Each sample for analysis is different from a configuration of an actual nonvolatile semiconductor memory, and the charge storage film 60 formed as a sample is not covered with any other film in order to facilitate analysis of compositions. Meanwhile, in the case of manufacturing such a nonvolatile semiconductor memory device as described in the first embodiment, the charge storage film 60 is formed, and then various films are further formed. Therefore, each charge storage region 33b (the charge storage film 60) is exposed to various temperatures (a temperature history).

As a method for deriving each preferred composition of the charge storage film 60, first, under the same conditions as those adopted for device creation, each single film is formed on a silicon substrate. Further, as a simulation of a temperature history at the time of forming a nonvolatile semiconductor memory device 100, annealing is performed only once in an $N_2$ atmosphere at 750° C. for 1 minute. Then, for example, inductively coupled plasma (ICC), Rutherford backscattering spectrometry and hydrogen forward scattering (RBS/HFS), or X-ray photoelectron spectroscopy (XPS) is used, and a composition of the charge storage film 60 is examined. As a result, such data as shown in FIG. 26 can be obtained.

<2.1 Preferred Range>

In a table shown in FIG. 26, it is assumed that amounts of nitrogen and oxygen in the charge storage film 60 are 20% or below in total under any conditions. Thus, based on the result shown in FIG. 26, when the compositions are organized, it can be understood that the following composition range is preferable. That is, the charge storage film 60 is assumed to contain carbon (C), Si, and hydrogen (H), or carbon (C), Si, and hydrogen (H), and at least one element selected from nitrogen (N) and oxygen (O). Moreover, assuming that this composition range is $Si_x(C_aN_bO_c)_yH_z$, it can be understood that $5 \leq x \leq 40$, $20 \leq y \leq 60$, $5 \leq z \leq 65$, $50 \leq a \leq 100$, $0 \leq b \leq 20$, and are preferable as this range.

<2.2 Generation Conditions and Others>

In this embodiment, the charge storage film 60 was formed by using the CVD method. However, the charge storage film 60 can be formed by using a sputtering method or the like. In the case of forming a film mainly containing carbon (the charge storage film 60), a hydrocarbon (CH)-based gas is often used as a reaction gas in the CVD method, but hydrogen H may remain in the charge storage film 60 depending on film forming conditions in some cases. The amount of residual hydrogen varies depending on film forming conditions, but can be in the range of 0.01 at. % to 20 at. %. Moreover, when a gas containing an element to be added is mixed into the reaction gas, a desired element can be added into the charge storage film 60. It is to be noted that, as the reaction gas, if a hydrocarbon based gas such as acethylene ($C_2H_2$) or propylene ($C_3H_6$) is used, a partial reaction can be caused by using hydrogen, nitrogen, oxygen, or the like so that the reaction gas can be added into the charge storage film 60, and an additive element can be introduced by using He, Ar, or nitrogen which is a carrier gas. Although there are several methods of CVD, using plasma CVD (PECVD) enables forming the charge storage film 60 at a relatively low temperature, which is preferable.

Additionally, an electric resistivity of the charge storage film 60 formed by the CVD is equal to or above $10^{-3}$ [Ω·cm] order depending on film forming conditions. The electric resistivity of the charge storage film 60 is sensitive to a film formation temperature in particular, and a highly resistive film can be obtained when the film formation temperature is low. When carbon alone is contained, it is substantially difficult to reduce the electric resistivity of the film by annealing or the like after formation of the thin film. If a treatment is to be performed, heating must be carried out at 1000° C. or above, and this heating can highly possibly damage other portions of the device. In the case of a film that contains Si, silane ($SiH_4$), disilane ($Si_2H_6$), tetramethylsilane ($Si(CH_3)_4$), TMS or the like is used as the reaction gas.

On the other hand, in the case of forming the charge storage film 60 by the sputtering method, this film is formed by sputtering a sputtering target made of graphite or the like using an inert gas. As this inert gas, since Ar or the like is used, hydrogen does not remain in the charge storage film 60. In the case of adding hydrogen, as the reaction gas, hydrogen or a gas containing hydrogen is mixed into the reaction gas, and the film is formed. It is to be noted that an element that is to be added can be mixed into the target, and this mixture can be used and added into the film. Although there are several methods of sputtering, magnetron sputtering is superior in mass production properties. When the sputtering target mainly containing graphite is used, the film can be formed by any one of DC and RF sputtering methods. Although a material with a high resistivity can be obtained depending on an additive element or its amount, the RF sputtering method can be used in such a case. The electric resistivity of the thin film formed by the sputtering method is in the $10^{-1}$ to $10^{-2}$ [Ω·cm] order or above, depending on film forming conditions. The electric resistivity is likewise sensitive to the film formation temperature, and a highly resistive film can be obtained when the film formation temperature is low. In the case of a film containing Si, SiC or a mixture of Si and C is used as a sputtering target.

<2.3 Functions and Effects of Second Embodiment>

According to the second embodiment, the charge storage film 60 preferably contains carbon (C), Si, and hydrogen (H), or carbon (C), Si, and hydrogen (H), and at least one element selected from nitrogen (N) and oxygen (O). Further, assuming that the composition range of the above elements is $Si_x(C_aN_bO_c)_yH_z$, it is further preferable for this range to be $5 \le x \le 40$, $20 \le y \le 60$, $5 \le z \le 65$, $50 \le a \le 100$, $0 \le b \le 20$, or $0 \le c \le 4$. Furthermore, when the charge storage film 60 is formed by the above-described various methods, a desired electric resistivity value can be obtained. Moreover, if the resistance of the charge storage film 60 is reduced, this reduction is preferable when the charge storage film 60 is used as a floating gate FG. Additionally, if the resistance of the charge storage film 60 is increased, this increase is preferable when the charge storage film 60 is used as a charge trap type charge storage film. That is, it is desirable for the charge storage film 60 to have low resistance or high resistance.

Third Embodiment

Figure 28:
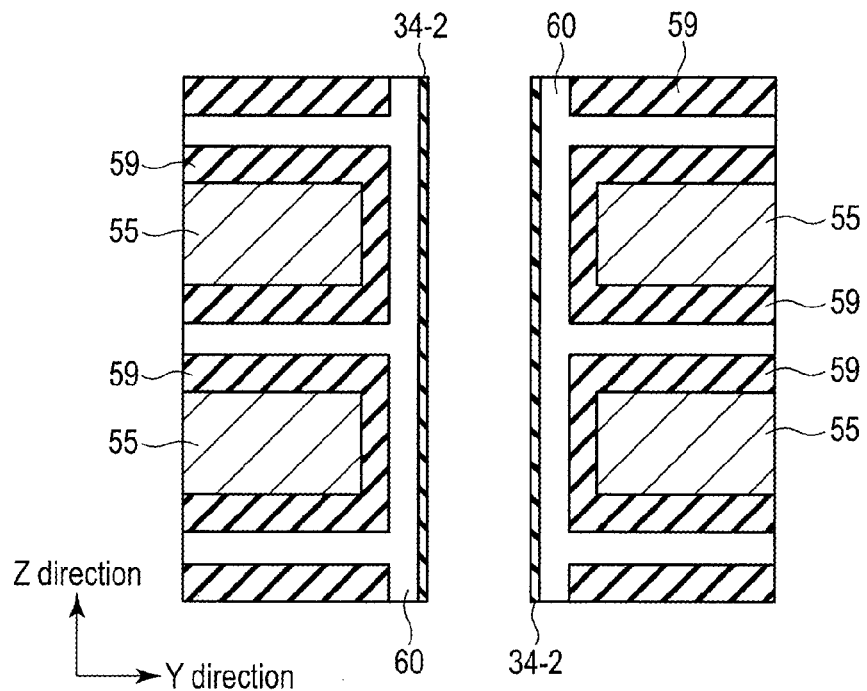
FIG. 28 is a cross-sectional view showing part of the basic manufacturing process of the nonvolatile semiconductor memory device according to the third embodiment.
Figure 29:
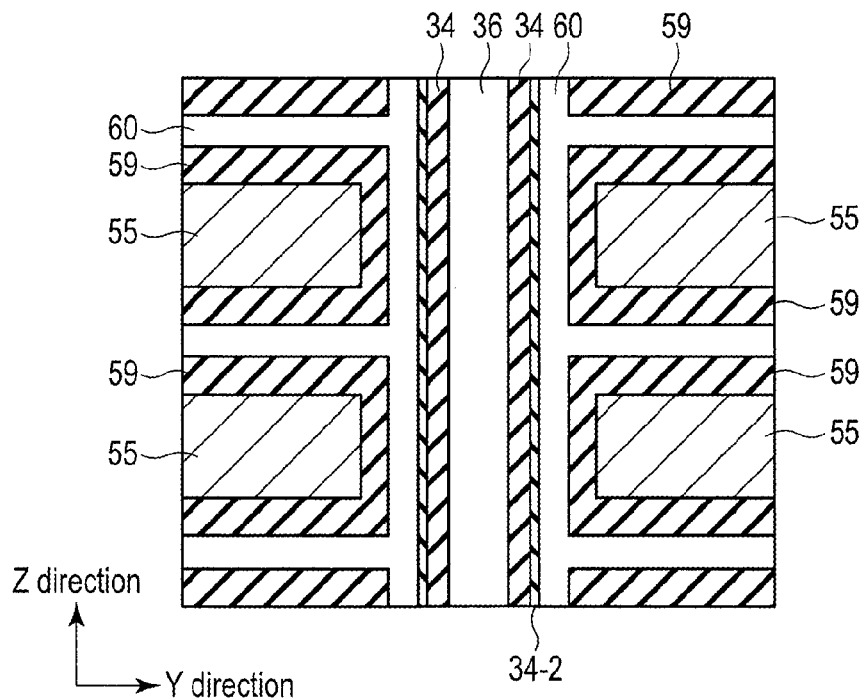
FIG. 29 is a cross-sectional view showing part of the basic manufacturing process of the nonvolatile semiconductor memory device according to the third embodiment.

A nonvolatile semiconductor memory device according to a third embodiment will now be described with reference to FIG. 27 to FIG. 29. In the third embodiment, a description will be given as to a case where a protective film 34-2 for avoiding film loss is formed on a thin film (a charge storage film 60) mainly containing carbon. Each of FIG. 27 to FIG. 29 is a cross-sectional view showing part of a basic manufacturing process of a nonvolatile semiconductor memory device according to the third embodiment. It is to be noted that a basic configuration and a basic operation are the same as those in the first and second embodiments. Therefore, a description on the matters explained in the first and second embodiments and the matters which can be easily analogized from the first and second embodiments will be omitted.

<3.1 Configuration of Protective Film>

First, a configuration of a protective film 32-2 will be described.

As shown in FIG. 27, a protective film 34-2 having a film thickness of 1 to 2 nm is provided between an intermediate insulating layer 33 and a tunnel insulating layer 34. This protective film 34-2 is used to prevent oxidation of each charge storage region 33b in the intermediate insulating layer 33 at the time of forming the main tunnel insulating layer 34. Therefore, this protective film 34-2 is made of a material that is difficult to oxidize. As the protective film 34-2, a material such as SiN, SiC, or CN is preferable. Since the protective film 34-2 is formed between each charge storage region 33b and the tunnel insulating layer 34, trap density is high, and charge storage characteristics are excellent.

<3.2 Manufacturing Method of Protective Film>

A manufacturing method of the protective film 34-2 will now be described.

As shown in FIG. 28, for example, in the case of forming a material that is difficult to oxidize, e.g., CN as the protective film 34-2 on a charge storage layer 60 after the charge storage layer 60 is formed (see FIG. 19), the protective film 34-2 can be formed on the charge storage layer 60 by nitriding the surface of the charge storage layer 60 for approximately 1 to 2 nm.

Further, as shown in FIG. 28, a silicon oxide is formed as a tunnel insulating layer 34 on the protective film 34-2. This silicon oxide film is formed in an oxidizing atmosphere such as oxygen plasma or an oxygen radical. In this case, since the protective film 32-2 is made of a material that is difficult to oxidize, oxidation of the charge storage film 60 can be suppressed when the protective film 32-2 is exposed to the oxidizing atmosphere. Then, when the processes shown in FIG. 21 to FIG. 25 are performed, the nonvolatile semiconductor memory device depicted in FIG. 27 can be formed.

It is to be noted that the protective film 34-2 is formed by nitriding the surface region of the charge storage film 60 in this example, but the present embodiment is not necessarily restricted thereto, and the protective film 34-2 may be directly deposited and formed on the charge storage film 60.

<3.3 Functions and Effects of Third Embodiment>

According to the third embodiment, the nonvolatile semiconductor memory device 100 further includes the fourth insulating layer 34-2 having SiN, SiC, or CN between the charge storage region 33b and the third insulating layer 34.

In the case of forming a silicon oxide as the tunnel insulating layer 34 on the surface of the charge storage film 60 mainly containing carbon, film loss of the charge storage film 60 may occur in some cases. It can be considered that, at the time of forming the silicon oxide on the charge storage film 60 mainly containing carbon, the oxygen plasma, the oxygen radial, or the like is used, and hence the charge storage film 60 is removed. As a result, the surface of the charge storage film 60 is removed, resulting in a problem that a desired film thickness cannot be obtained.

Thus, in the case of forming the tunnel insulating layer 34 by forming the protective film 34-2 having the material that is difficult to oxidize on the charge storage film 60, the charge storage film 60 is not exposed to the oxidizing atmosphere. As a result, the high-quality charge storage region 33b can be formed.

Fourth Embodiment

A nonvolatile semiconductor memory according to a fourth embodiment will now be described with reference to FIG. 30 to FIG. 34. In the fourth embodiment, a description will be given as to an example where a film mainly containing carbon is applied to a charge storage layer of a planar type, i.e., a so-called floating type NAND flash memory.

<4.1 Overall Configuration of NAND Flash Memory>

Figure 30:
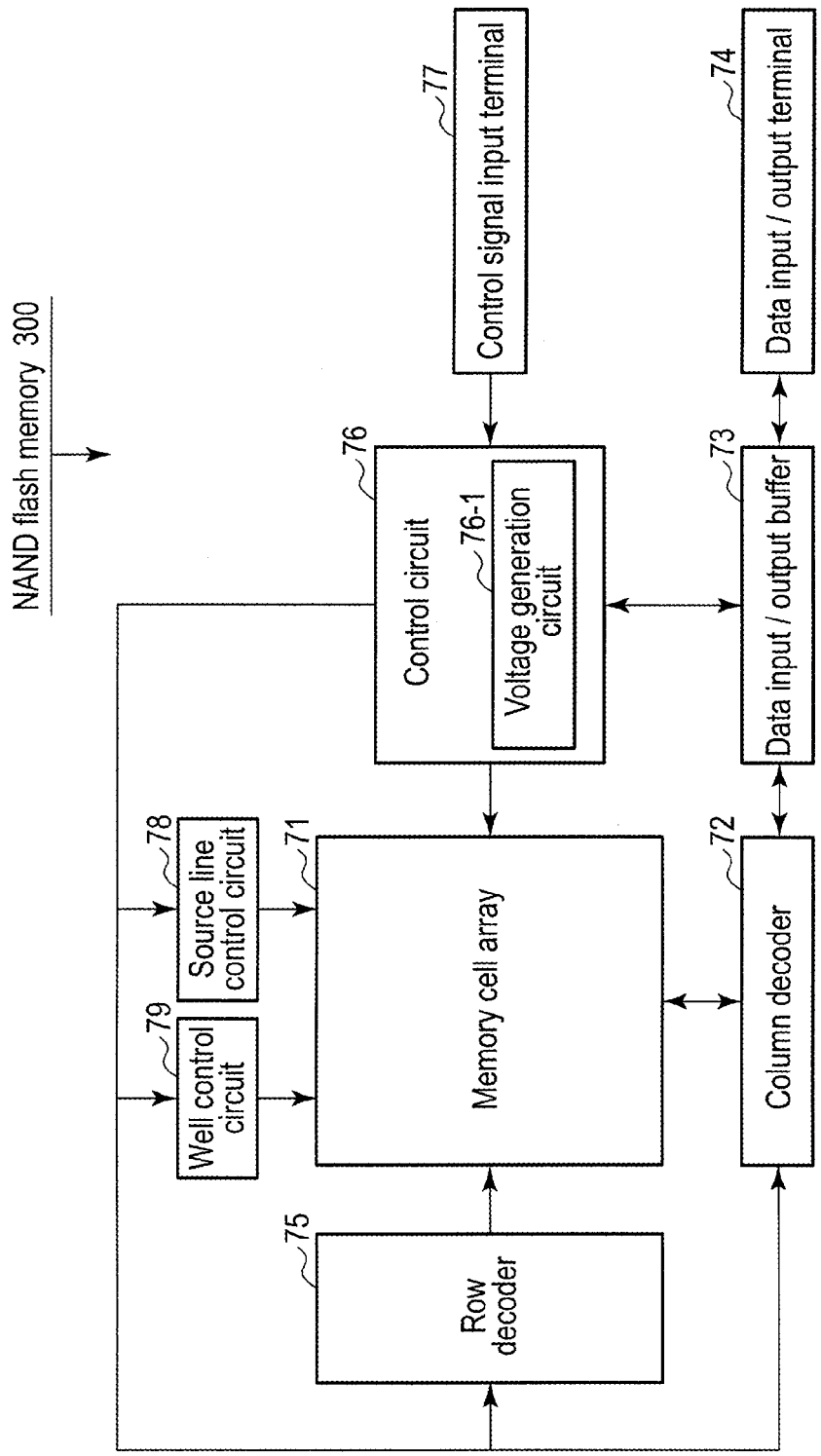
FIG. 30 is a block diagram schematically showing a basic configuration of an NAND flash memory according to a fourth embodiment.

A configuration of an NAND flash memory 300 according to the fourth embodiment will now be roughly described with reference to FIG. 30. FIG. 30 is a block diagram schematically showing a basic configuration of the NAND flash memory 300 according to the fourth embodiment.

As shown in FIG. 30, the NAND flash memory 300 includes a memory cell array 71, a column decoder 72, a data input/output buffer 73, a data input/output terminal 74, a row decoder 75, a control circuit 76, a control signal input terminal 77, a source line control circuit 78, and a well control circuit 79.

The memory cell array 71 includes bit lines BL, word lines WL, and source lines SL. This memory cell array 71 is constituted of blocks BLK in which electrically rewritable memory cell transistors (which will be also simply referred to as memory cells or the like) MT are arranged in a matrix shape. Each memory cell transistor MT has, e.g., a lamination gate including a control gate electrode and a charge storage layer (e.g., a floating gate electrode) and stores two-level or multi-level data in accordance with a change in threshold value of the transistor which is determined by an amount of electric charges implanted into the floating gate electrode. Further, the memory cell transistor MT may have a metal-oxide-nitride-oxide-silicon (MONOS) structure that traps electrons in a nitrogen film.

The column decoder 72 has a sense amplifier (not shown) that performs sense amplification with respect to a voltage of each bit line BL in the memory cell array 71, a data memory circuit (not shown) configured to latch data which is to be written, and others. The column decoder 72 reads out data in each memory cell transistor MT in the memory cell array 71 through each bit line BL, detects a state of the memory cell transistor MT through each bit line BL, or applies a write control voltage to the memory cell transistor MT through each bit line BL, and writes data into this memory cell transistor MT.

Furthermore, the column decoder 72 selects the data memory circuit in the column decoder 72 and outputs data in the memory cell transistor MT, which has been read out to this data memory circuit, to the outside (a host) from the data input/output terminal 74 through the data input/output buffer 73.

The data input/output buffer 73 receives data from the data input/output terminal 74 and stores it in the data memory circuit selected by the column decoder 72. Moreover, the data input/output buffer 73 outputs data to the outside through the data input/output terminal 74.

The data input/output terminal 74 receives various commands such as write, read, erase, status read, and others and addresses besides the write data.

At the time of a read operation, write operation, or an erase operation of data, the row decoder 75 selects any block BLK and sets remaining blocks BLK to a non-selected mode. That is, the row decoder 75 applies a voltage required for the read operation, the write operation, or the erase operation to each word line WL and selection gate lines VSGS and VSGD of the memory cell array 71.

The source line control circuit 78 is connected to the memory cell array 71. The source line control circuit 78 controls a voltage in each source line SL.

The well control circuit 79 is connected to the memory cell array 71. This well control circuit 79 is configured to control a voltage in a semiconductor substrate (a well) where each memory cell transistor MT is formed.

The control circuit 76 controls the memory cell array 71, the column decoder 72, the data input/output buffer 73, the row decoder 75, the source line control circuit 78, and the well control circuit 79. It is assumed that the control circuit 76 includes, e.g., a voltage generation circuit 76-1 that boosts a power supply voltage. The control circuit 76 boosts the power supply voltage by using the voltage generation circuit 76-1 as required and applies the boosted voltage to the column decoder 72, the data input/output buffer 73, the row decoder 75, and the source line control circuit 78.

The control circuit 76 performs a control operation in accordance with a control signal (e.g., a command latch enable signal CLE, an address latch enable signal ALE, or a ready/busy signal RY/BY) input from the outside through the control signal input terminal 77 and a command input from the data input/output terminal 74 through the data input/output buffer 73. That is, at the time of programming, verifying, reading, or erasing data, the control circuit 76 generates a desired voltage in accordance with the control signal and the command and supplies it to each portion in the memory cell array 71.

<4.2 Outline of Memory Cell Array>

A basic configuration of the memory cell array 71 according to the fourth embodiment will now be roughly explained. FIG. 31 is a block diagram schematically showing the basic configuration of the memory cell array 71 according to the embodiment. Furthermore, FIG. 32 shows a circuit example of one memory block in the memory blocks depicted in FIG. 31.

As shown in FIG. 31, the memory cell array 71 is constituted of memory blocks BLOCK 1 to BLOCK m (m is an integer that is not smaller than 1). The memory blocks BLOCK 1 to BLOCK m are aligned in a bit line BL direction (a column direction).

As shown in FIG. 32, one memory block includes NAND cells (which will be also referred to as a cell unit, an NAND string, or the like) aligned in a word line WL direction (a row direction).

One NAND cell includes memory cell transistors (which will be also simply referred to as memory cells) connected in series, a selection gate transistor ST1 connected to a drain of the memory cell transistor MT at one end, and a selection gate transistor ST2 connected to a source of the memory cell at the other end.

The memory cell transistor MT has a charge storage layer formed on the semiconductor substrate to interpose a gate insulating layer, the gate insulating layer formed on the charge storage layer, and a control gate electrode formed on the gate insulating layer. It is to be noted that the number of the memory cell transistors MT is not restricted to 8, and it may be 16, 32, 64, 128, or 256, and this number is not limited. Moreover, the memory cell transistors MT that are adjacent to each other share the source and the drain. Additionally, the memory cell transistors MT are arranged in such a manner that their current paths are connected in series between the selection gate transistors ST1 and ST2. A drain region on one end side of the memory cell transistor MT connected in series is connected to a source region of the selection gate transistor ST1, and a source region of the memory cell transistor MT on the other end side is connected to a drain region of the selection gate transistor ST2.

Bit lines BL0 to BLq-1 (q is an integer that is not smaller than 1) are connected to the drain of the selection gate transistor ST1. The source line SL is connected to the source of the selection gate transistor ST2. It is to be noted that the bit lines BL0 to BLq-1 will be collectively referred to as the bit line BL when they do not have to be discriminated from each other. Further, both the selection transistors ST1 and ST2 are not necessarily required, and one of the selection transistors alone may be provided if each NAND cell can be selected.

Word lines WL0 to WLn-1 (n is an integer that is not smaller than 1) extend in the WL direction, and they are connected to the memory cells which are adjacent to each other in the WL direction in common. It is to be noted that the word lines WL0 to WL7 may be simply referred to as the word lines WL hereinafter to simplify the explanation when the word lines WL0 to WL7 are not discriminated from each other.

Each of select gate lines SGD and SGS is connected to gate electrodes of the selection transistors ST1 or ST2 of the memory cells.

Further, data is collectively written into the memory cell transistors MT connected to the same word line WL, and this unit is called a page. Furthermore, data in the NAND cells that are present in the same row is collectively erased, and this unit is called a memory block.

A plan view of the memory cell array 71 having the above configuration will now be described with reference to FIG. 33.

As shown in FIG. 33, in an n-type semiconductor substrate, stripe-like device areas AA (active areas) each of which extends in the bit line BL direction are provided along the word line WL direction orthogonal to the bit line BL direction. Each shallow trench isolation STI extending in the bit line BL direction is formed between the device areas AA which are adjacent to each other, and the device areas AA are electrically isolated from each other by this shallow trench isolation STI.

On the semiconductor substrate, the stripe-like word lines WL and select gate lines SGD and SGS in the word line WL direction are formed to cut across the device areas AA. Furthermore, the memory cell transistor MT is provided in each region where the word line WL crosses the device area AA, and the selection transistor ST1 or ST2 is provided in each region where the select gate line SGD or SGS crosses the device area AA.

An impurity diffusion layer that functions as a source region or the drain region of each memory cell transistor MT or the selection transistor ST1 or ST2 is formed in the device areas AA between the word lines WL, between the select gate lines, and between the word line WL and the select gate line that are adjacent to each other in the bit line BL direction.

The impurity diffusion layer formed in each device area AA between the select gate lines SGD that are adjacent to each other in the bit line BL direction functions as the drain region of the selection transistor ST1. Moreover, a contact plug CP1 is formed on this drain region. The contact plug CP1 is connected to the stripe-like bit line BL (not shown) provided along the bit line BL direction.

Additionally, the impurity diffusion layer formed in the device area AA between the select gate lines SGS that are adjacent to each other in the bit line direction BL functions as the source region of the selection transistor ST2. Further, on this source region, a contact plug CP2 is formed. The contact plug CP2 is connected to the non-illustrated source line SL.

A cross-sectional configuration of the memory cell array 71 having the above configuration will now be described with reference to FIG. 34. FIG. 34 is a cross-sectional view taken along a line A-A in FIG. 33.

As shown in FIG. 34, an n-type well region (n-well) 201 is formed in a surface region of a p-type semiconductor substrate (p-substrate) 200, and a p-type well region (p-well) 202 is formed on the n-type well region 201. It is to be noted that the p-type semiconductor substrate 200, the n-type well region 201, and the p-type well region 202 may be simply referred to as semiconductor substrates 200 to 202.

For example, a silicon oxide film that functions as a tunnel insulating layer 204 is formed on the active area AA of the n-type well region 202, and gate structures of the memory cell transistors MT and the selection transistors ST1 and ST2 are formed on the tunnel insulating layer 204. The tunnel insulating layer 204 in each memory cell transistor MT functions as a tunnel film where electrons tunnel.

The gate structure of each memory cell transistor MT has a laminated structure. That is, the gate structure includes a charge storage film 205 formed on the tunnel insulating layer 204, an insulating layer 206 formed on the charge storage film 205, and an electrode layer 207 formed on the insulating layer 206. The charge storage film 205 functions as a charge storage layer that stores electric charges, and the insulating layer 206 functions to trap electric charges in the charge storage film 205. Further, the electrode layer 207 functions as a control gate (the word line WL). Furthermore, a so-called air gap portion 209 is formed between the memory cell transistors MT. It is to be noted that the charge storage film 205 is made of the material mainly containing carbon (C) described in the second embodiment. When the charge storage film 205 is used as a floating gate FG, a low-electric resistivity state is more preferable as described in the second embodiment. In terms of a composition, a state that the content of carbon is larger than the content of any other element is preferable. Moreover, it is also preferable for the insulating layer 206 to be formed of a laminated film including an oxide film or a nitride film.

The charge storage film 205, the insulating layer 206, and the electrode layer 207 in the memory cell transistor MT may be referred to as a charge storage film 205, a gate insulating layer 206, and a control gate electrode 207, respectively in some cases. The charge storage film 205 is separated in accordance with each memory cell transistor MT, and the gate insulating layer 206 and the control gate electrode 207 are connected in common between the memory cell transistors MT which are adjacent to each other in the word line WL direction. That is, the control gate electrode layer 207 in each memory cell transistor MT is connected in common between the active areas AA adjacent to each other to cut across the shallow trench isolations that are adjacent to each other in the direction parallel to the word lines.

The gate structure of each of the selection transistors ST1 and ST2 includes the charge storage film 205 formed on the tunnel insulating layer 204, the insulating layer 206 formed on part of the charge storage film 205, and the electrode layer 207 formed on the insulating layer 206 and part of the charge storage film 205. In the gate structure of each of the selection transistors ST1 and ST2, part of the charge storage film 205 is electrically connected to the electrode layer 207. Additionally, here, the electrode layer 207 is also referred to as a gate electrode 207 for the convenience's sake. In the selection transistors ST1 and ST2, the gate electrodes 207 that are adjacent to each other in the word line WL direction are connected in common. Further, each gate electrode 207 functions as the select gate line SGS or SGD.

Furthermore, on the surface of the p-type semiconductor substrate 200 placed between the gate electrodes, an n+ type impurity diffusion layer 203 is formed. The n+ type impurity diffusion layer 203 is shared by the transistors that are adjacent to each other, and it functions as a source (S) or a drain (D). Moreover, a region between the source and the drain that are adjacent to each other (a region immediately below the gate electrode) functions as a channel region that serves as an electron transfer region. The gate electrodes, the n+ type impurity diffusion layer 203, and the channel region form each of the memory cell transistor MT and the selection transistors ST1 and ST2.

Additionally, an interlayer insulating layer 208 is formed on the p type semiconductor substrate 200 to cover the memory cell transistors MT and the selection transistors ST1 and ST2. In the interlayer insulating layer 208, a contact plug CP2 that reaches the impurity diffusion layer (the source) 203 of the selection transistor ST2 on the source side is formed.

Further, in the interlayer insulating layer 208, a contact plug CP1 that reaches the impurity diffusion layer (the drain) 203 of the selection transistor ST on the drain side is formed.

(Modifications and Others)

It is to be noted that the insulating region 33a is explained as the silicon oxide film in the first embodiment, but the present embodiment is not restricted thereto, and any structure can be adopted as long as the insulating region 33a can electrically separate each charge storage region 33b in the Z direction in accordance with each memory cell transistor and, for example, an air gap portion may be used.

Further, although not shown, SiN, SiC, or CN may be arranged between the intermediate insulating layer 32 on the control gate electrode CG side and the charge storage region 33b. In this case, the charge storage characteristics can be improved.

Furthermore, in the nonvolatile semiconductor memory device 100 explained in the first to third embodiments, as the charge storage region 33b mainly containing carbon, carbon nanotubes (CNT) may be used. In this case, the CNT alone may be used, or a structure where the CNT are dispersed in $SiO_2$ may be adopted.

Moreover, in the fourth embodiment, upper and lower interfaces of the charge storage film 205 or a side surface of the charge storage film 205 may be covered with a protective film that is difficult to oxidize, e.g., SiN, SiC, or CN. In this case, when the charge storage film 205 is exposed to the oxidizing atmosphere or brought into contact with the oxide film during a manufacturing process, covering the charge storage layer 205 with the protective film enables suppressing deterioration of the charge storage film 205. In the case of forming the protective film on each of the upper and lower interfaces of the charge storage film 205, using a material such as SiN is preferable.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
    a substrate;
    a laminated film which has a configuration where first insulating layers and first electrode layers are alternately laminated in a first direction vertical to the substrate;
    a second insulating layer formed on an inner wall of a first through hole pierced in the first insulating layers and the first electrode layers along the first direction;
    an intermediate layer formed on a surface of the second insulating layer;
    a third insulating layer formed on a surface of the intermediate layer; and
    a pillar-like first semiconductor region which is formed on a surface of the third insulating layer and extends along the first direction,
    wherein the intermediate layer comprises: charge storage regions which mainly contain carbon at positions where the charge storage regions are adjacent to the first electrode layer in a second direction orthogonal to the first direction; and insulating regions which electrically separate the charge storage regions adjacent to each other along the first direction at positions where the insulating regions are adjacent to the first insulating layer in the second direction.

2. The device according to claim 1, further comprising a fourth insulating layer which contains SiN, SiC, or CN between the charge storage regions and the third insulating layer.

3. The device according to claim 1,
    wherein the charge storage regions further contain at least one of hydrogen, silicon, nitrogen, and oxygen.

4. The device according to claim 1,
    wherein the charge storage regions contain carbon nanotubes.

5. The device according to claim 1, further comprising:
    a second electrode layer provided between the substrate and the laminated film;
    a second through hole which is formed in the second electrode layer and also formed along at least a third direction orthogonal to the first direction; and
    a pillar-like second semiconductor region which extends along the third direction,
    wherein the second insulating layer, the intermediate layer, and the third insulating layer are formed on an inner wall of the second through hole, and
    the second semiconductor region is formed on a surface of the third insulating layer formed in the second through hole.

6. The device according to claim 5,
    wherein the second semiconductor region has one end connected to the first semiconductor region, and the other end connected to the other first semiconductor region.

7. The device according to claim 6, further comprising a fourth insulating layer which is provided in the laminated film and extends along the second direction.

8. The device according to claim 5, further comprising a fourth insulating layer provided between the substrate and the second electrode layer.

9. The device according to claim 1, further comprising:
    a fourth insulating layer formed on the laminated film; and
    a selection gate electrode provided on the fourth insulating layer.

10. The device according to claim 1, wherein the insulating region is an air gap portion.

11. The device according to claim 1,
    wherein the charge storage region contains carbon (C), Si and hydrogen (H), or carbon (C), Si, hydrogen (H) and at least one selected from the group consisting of nitrogen (N) and oxygen (O).

12. The device according to claim 11,
    wherein a composition range of the charge storage region is $Si_x(C_aN_bO_c)_yH_z$, and ranges of x, y, z, a and b are $5 \leq x \leq 40$, $20 \leq y \leq 60$, $5 \leq z \leq 65$, $50 \leq a \leq 100$, $0 \leq b \leq 20$, and $0 \leq c \leq 4$.

13. The device according to claim 2,
    wherein the fourth insulating layer is also provided between the insulating region and the third insulating layer.

* * * * *